US009104922B2

(12) United States Patent
Pant et al.

(10) Patent No.: US 9,104,922 B2
(45) Date of Patent: Aug. 11, 2015

(54) ANISOTROPIC MAGNETO-RESISTANCE (AMR) GRADIOMETER/MAGNETOMETER TO READ A MAGNETIC TRACK

(71) Applicant: Honeywell International Inc., Morristown, MN (US)

(72) Inventors: Bharat B. Pant, Minneapolis, MN (US); Lakshman Withanawasam, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 351 days.

(21) Appl. No.: 13/674,337

(22) Filed: Nov. 12, 2012

(65) Prior Publication Data

US 2013/0334311 A1 Dec. 19, 2013

Related U.S. Application Data

(60) Provisional application No. 61/660,482, filed on Jun. 15, 2012.

(51) Int. Cl.
*G01R 33/02* (2006.01)
*G06K 7/08* (2006.01)
(Continued)

(52) U.S. Cl.
CPC ................ *G06K 7/082* (2013.01); *G01R 33/09* (2013.01); *G06K 7/084* (2013.01); *G06K 19/06196* (2013.01)

(58) Field of Classification Search
CPC .... G01R 33/096; G01R 33/09; G01R 33/072; G01R 33/091; G06K 7/082; G06K 7/084; G06K 19/09196; B82Y 25/00; G01D 5/12; G01B 7/14; G01P 13/00; H01L 43/08
USPC ............. 324/207.21, 228, 244, 252; 235/449, 235/493; 257/108, 414, 421–427; 338/32; 360/18, 20–22, 77.02, 77.06–77.07, 360/113; 369/30.1, 44.18, 13.05, 13.1, 369/13.37
See application file for complete search history.

(56) References Cited

U.S. PATENT DOCUMENTS 3,949,193 A * 4/1976 Dowdell ........................ 235/449
4,518,919 A * 5/1985 Ishida ........................... 324/228
(Continued)

FOREIGN PATENT DOCUMENTS

DE 102007040183 A1 * 3/2009 ............. G01R 33/09
JP 03029106 A * 2/1991 ............... G11B 5/39
WO WO 2012103950 A1 * 8/2012

OTHER PUBLICATIONS

Unknown, Magnetic Stripe Reader, 2008, Silicon Laboratories Inc., Revision 1.3 (Aug. 2008), pp. 1-5.*
(Continued)

*Primary Examiner* — Patrick Assouad
*Assistant Examiner* — Sean Curtis
(74) *Attorney, Agent, or Firm* — Fogg & Powers LLC

(57) ABSTRACT

A solid state magnetic sensor for sensing magnetic information on a magnetic track is provided. The solid state magnetic sensor includes at least one half of a Wheatstone bridge including at least two legs, each of the at least two legs including at least a portion of a strip of magnetic material, and barber pole nonmagnetic shorting bars arranged on the portions of the strip forming the at least two legs of the at least one half of the Wheatstone bridge. An inner gap between parallel and adjacent strips of a respective at least two legs is on the order of a transition length on the magnetic track to be sensed.

20 Claims, 24 Drawing Sheets

(51) Int. Cl.

| | |
|---|---|
| ***G01R 33/09*** | (2006.01) |
| ***G06K 19/06*** | (2006.01) |

(56) References Cited

U.S. PATENT DOCUMENTS

| | | | | |
|---|---|---|---|---|
| 4,585,930 | A * | 4/1986 | Casden | 235/449 |
| 4,613,915 | A * | 9/1986 | Crouse et al. | 360/77.02 |
| 4,626,946 | A * | 12/1986 | Vinal | 360/315 |
| 4,628,195 | A * | 12/1986 | Baus | 235/440 |
| 4,642,709 | A * | 2/1987 | Vinal | 360/77.05 |
| 4,791,283 | A * | 12/1988 | Burkhardt | 235/438 |
| 5,057,678 | A * | 10/1991 | Ichikawa | 235/449 |
| 5,247,278 | A * | 9/1993 | Pant et al. | 338/32 R |
| 5,491,461 | A * | 2/1996 | Partin et al. | 338/32 R |
| 5,546,462 | A | 8/1996 | Indeck et al. | |
| 5,638,345 | A * | 6/1997 | Hosoya | 369/30.1 |
| 5,650,606 | A * | 7/1997 | Baus, Jr. | 235/449 |
| 5,714,747 | A * | 2/1998 | West et al. | 235/493 |
| 5,740,244 | A | 4/1998 | Indeck et al. | |
| 6,481,623 | B1 * | 11/2002 | Grant et al. | 235/449 |
| 6,538,437 | B2 * | 3/2003 | Spitzer et al. | 324/252 |
| 6,579,728 | B2 * | 6/2003 | Grant et al. | 438/3 |
| 6,809,515 | B1 * | 10/2004 | Li et al. | 324/260 |
| 6,984,978 | B2 * | 1/2006 | Wan et al. | 324/252 |
| 7,256,969 | B1 * | 8/2007 | Arnold et al. | 360/313 |
| 7,377,433 | B2 | 5/2008 | Morley, Jr. et al. | |
| 7,478,751 | B2 | 1/2009 | Morley, Jr. et al. | |
| 7,505,233 | B2 * | 3/2009 | Grimm et al. | 360/321 |
| 7,891,567 | B2 | 2/2011 | Burden et al. | |
| 7,924,534 | B2 * | 4/2011 | Grimm et al. | 360/321 |
| 8,525,514 | B2 * | 9/2013 | Cai et al. | 324/252 |
| 2005/0116307 | A1 * | 6/2005 | De Jongh et al. | 257/414 |
| 2006/0126229 | A1 * | 6/2006 | Grimm et al. | 360/319 |
| 2006/0171081 | A1 * | 8/2006 | Brcuer et al. | 360/313 |
| 2007/0241201 | A1 * | 10/2007 | Brown et al. | 235/493 |
| 2009/0218401 | A1 * | 9/2009 | Moran et al. | 235/439 |
| 2011/0174879 | A1 * | 7/2011 | Morley, Jr. | 235/449 |
| 2011/0193556 | A1 * | 8/2011 | Paci et al. | 324/251 |
| 2011/0210722 | A1 * | 9/2011 | Paci et al. | 324/207.25 |
| 2011/0227569 | A1 * | 9/2011 | Cai et al. | 324/252 |
| 2012/0161756 | A1 * | 6/2012 | Paci et al. | 324/228 |
| 2013/0241543 | A1 * | 9/2013 | Stenson et al. | 324/252 |
| 2013/0300408 | A1 * | 11/2013 | Qiu et al. | 324/252 |
| 2014/0015525 | A1 * | 1/2014 | Paci et al. | 324/252 |
| 2014/0263646 | A1 * | 9/2014 | Manesh | 235/440 |
| 2014/0266185 | A1 * | 9/2014 | Sidman | 324/252 |
| 2014/0353785 | A1 * | 12/2014 | Paci | 257/427 |

OTHER PUBLICATIONS

Stutzke et al., "Low-Frequency Noise Measurements on Commercial Magnetoresistive Magnetic Field Sensors", "J. Appl. Phys. 97, 10Q107", May 2005, pp. 1-4.

* cited by examiner

FIG. 1*i*
(PRIOR ART)

ANISOTROPIC MAGNETO-RESISTANCE (AMR) GRADIOMETER/MAGNETOMETER TO READ A MAGNETIC TRACK

This application claims the benefit of U.S. Provisional Application No. 61/660,482, entitled ANISOTROPIC MAGNETO-RESISTANCE (AMR) GRADIOMETER/MAGNETOMETER FOR USE IN MAGNETIC CARD READERS, and filed on Jun. 15, 2012, which is incorporated herein by reference in its entirety.

BACKGROUND

Magnetic credit card reader devices are ubiquitous, being present at Automated Teller Machines (ATMs), at vendor checkouts, at identity card readers, etc. Their use is increasing with increasing Internet commerce, which brings with it greater need for security. Inductive heads have been used as magnetic sensors with magnetic card reader devices for decades. Inductive heads generate voltage output when moved above written transitions between magnetic bits in a magnetic track. The output voltage waveforms are fed into electronics to be digitized and encrypted before being transmitted to servers over wired or wireless networks.

Each piece of magnetic-written medium has a unique noise signature. Fingerprints of the noise in the regions between written transitions on the written medium provide an additional security feature. A noise fingerprint for each magnetic card is stored on servers when a credit card is issued to a user. At the point of sale, the information encoded in transitions (card number, user ID, etc.), as well as the noise signature is transmitted to the server where this information is stored. A high correlation between the stored noise fingerprint and received noise fingerprint from the transaction is a means of authentication and ensures extra security.

The interface between the inductive readers and signal processing electronics represents a weak point in the prior art systems. It is possible to break into card reader devices and tap into the signals at the interface, thus bypassing digitization and encryption.

SUMMARY

The present application relates to a solid state magnetic sensor for sensing magnetic information on a magnetic track. The solid state magnetic sensor includes at least one half of a Wheatstone bridge including at least two legs, each of the at least two legs including at least a portion of a strip of magnetic material, and barber pole nonmagnetic shorting bars arranged on the portions of the strip forming the at least two legs of the at least one half of the Wheatstone bridge. An inner gap between parallel and adjacent strips of a respective at least two legs is on the order of a transition length on the magnetic track to be sensed.

DRAWINGS

FIG. 1 is a schematic of one embodiment of a magnetic card with three written tracks in a magnetic strip;

FIG. 1*i* shows an enlarged view of four magnetic bits in one written track of FIG. 1 with transitions interposed between adjacent magnetic bits;

In accordance with common practice, the various described features are not drawn to scale but are drawn to emphasize features relevant to the present invention. Like reference characters denote like elements throughout figures and text.

DETAILED DESCRIPTION

The above referenced problem for magnetic card readers is solved by building a solid state sensor atop, or adjacent to, on-chip CMOS electronics for signal conditioning. As defined herein, a solid state sensor is an Anisotropic Magneto-Resistance (AMR) sensor. In one implementation of this embodiment, the AMR sensor is adjacent to on-chip CMOS electronics and is communicatively coupled to the on-chip CMOS electronics with in-substrate vias.

The solid state sensor provides a robust interface between the sensor and signal processing and control electronics of a magnetic credit card reader. A packaged sensor integrated with electronics at the wafer level represents a higher level of security. The process of trying to tap into the raw signals from such a sensor frequently destroys the entire package. Solid state sensors offer the possibility of lower subsystem cost than one assembled from discrete components. The lower subsystem includes the sensor and supporting electronics.

AMR sensors offer low noise level over the bandwidth relevant to credit card applications (see Nathan A. Stutzke, et al., J. Appl. Phys. 97, 10Q107 (2005)). The resulting high resolution is useful in reading the low-level magnetic signals from the noise pattern in the region between transitions as described above.

The magnetic track sensors described herein are useful to read the at least one magnetic track (written track) on currently available magnetic cards, such as credit cards, and store loyalty cards. The currently available magnetic cards typically have a magnetic strip that includes three magnetic tracks that extend the length of the magnetic card. The three magnetic tracks of the magnetic strip are typically written at two different bit densities (210 bits per inch (bpi) and 75 bpi) in accordance with the ISO/IEC 7811-6 International Standard. The magnetic track readers described herein are useful to read at least one magnetic track on any currently available or future developed device, component, object, etc. Since magnetic card readers are currently available, the discussion of magnetic track readers herein is directed to, but not limited to, magnetic card readers.

Figure 1:
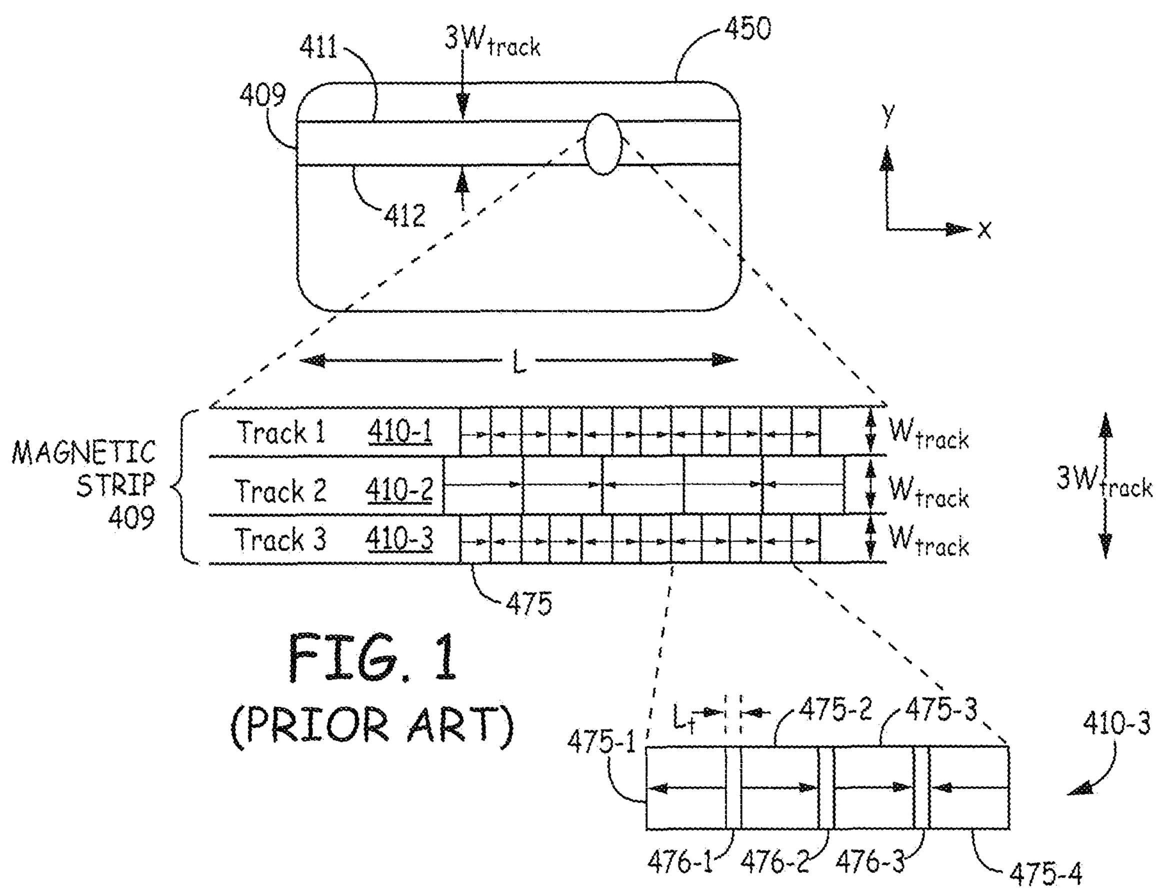

FIG. 1 is a schematic of one embodiment of a magnetic card 450 with three magnetic tracks (1-3) in a magnetic strip 409. FIG. 1*i* shows an enlarged view of four magnetic bits 475(1-4) in one magnetic track 410 of FIG. 1 with transitions 476(1-3) interposed between adjacent magnetic bits 475-1/475-2, 475-2/475-3 and 475-3/475-4. The transitions 476-1, 476-2, and 476-3 between neighboring magnetic bits 475-1/475-2, 475-2/475-3 and 475-3/475-4, respectively, have a non-zero length that is determined by the magnetic properties of the magnetic strip medium and the write head used to encode the data. The length of the transitions 476(1-3) is referred to herein as "transition length $L_t$". The transition length $L_t$ is generally on the order of microns for credit cards.

The "magnetic tracks 410(1-3)" are also referred to as "written tracks 410(1-3)", "tracks 410(1-3)", and "recorded surface 410(1-3)". The magnetic written tracks 410(1-3) are encoded (written) with data that provides information about the owner of the magnetic card, the issuer of the magnetic card 450, and any other pertinent information as is known to one skilled in the art. Each written track 410(1-3) has a track width $W_{track}$. In one implementation of this embodiment, each track width $W_{track}$ is 3 mm. In another implementation of this embodiment, the total width $3W_{track}$ of the magnetic strip 409 on the magnetic card is about 10 mm. In yet another implementation of this embodiment, the bit density on tracks 410-1 and 410-3 is 210 bpi while the middle track 410-2 has a bit density of 75 bpi. The major surface of the magnetic card is in the x-y plane. The terms "magnetic card" and "credit card" are used interchangeably herein.

Figure 2:
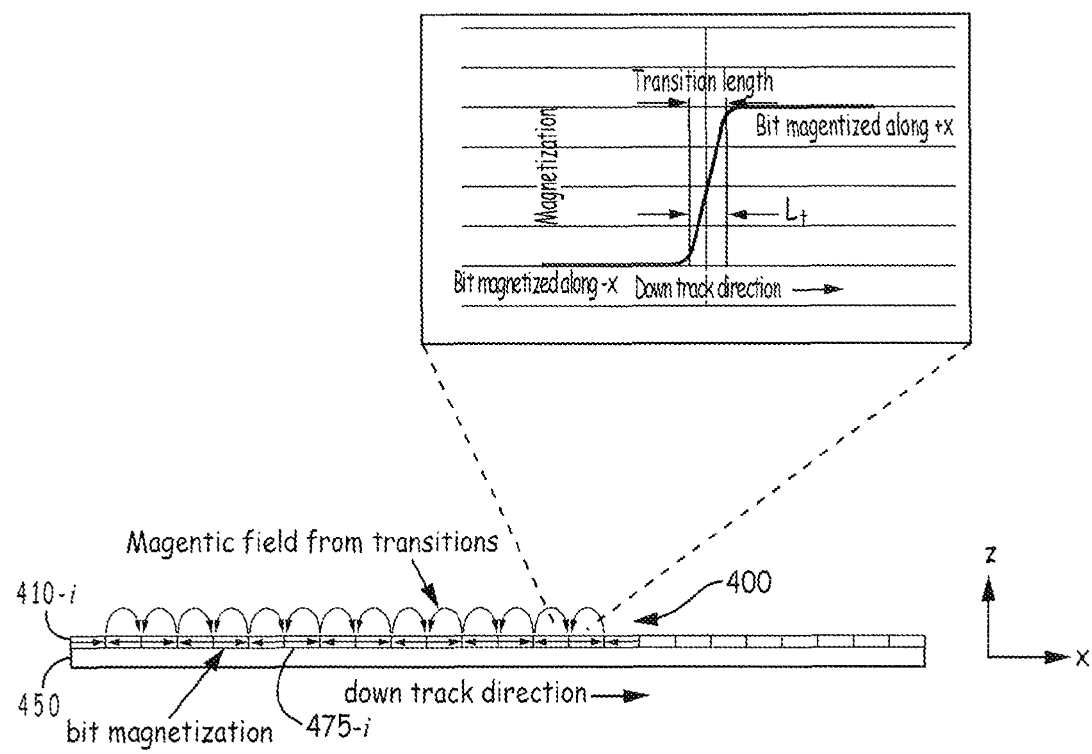
FIG. 2 is a cross-sectional view of an exemplary written track on a magnetic card and a magnetic field correlated to transitions in a portion of the exemplary written track.

FIG. 2 is a cross-sectional view of an exemplary written track 410-*i* on a magnetic card 450 and a magnetic field correlated to transitions in a portion of the exemplary written track 410-*i*. The written track 410-*i* is the $i^{th}$ track in a magnetic strip 409. The transitions (e.g., transitions 476(1-3) shown in FIG. 1*i*) between the magnetized bits (e.g., magnetized bits 475(1-3) shown in FIG. 1*i*) create the magnetic fields represented generally at 400 along the downtrack direction in the region above the plane of the magnetic strip 409 (FIG. 1). As referred to herein, the positive x direction is the downtrack direction, and the z direction is perpendicular to the x-y plane of the magnetic card 450. The y direction is referred to herein as the cross-track direction.

Figure 3:
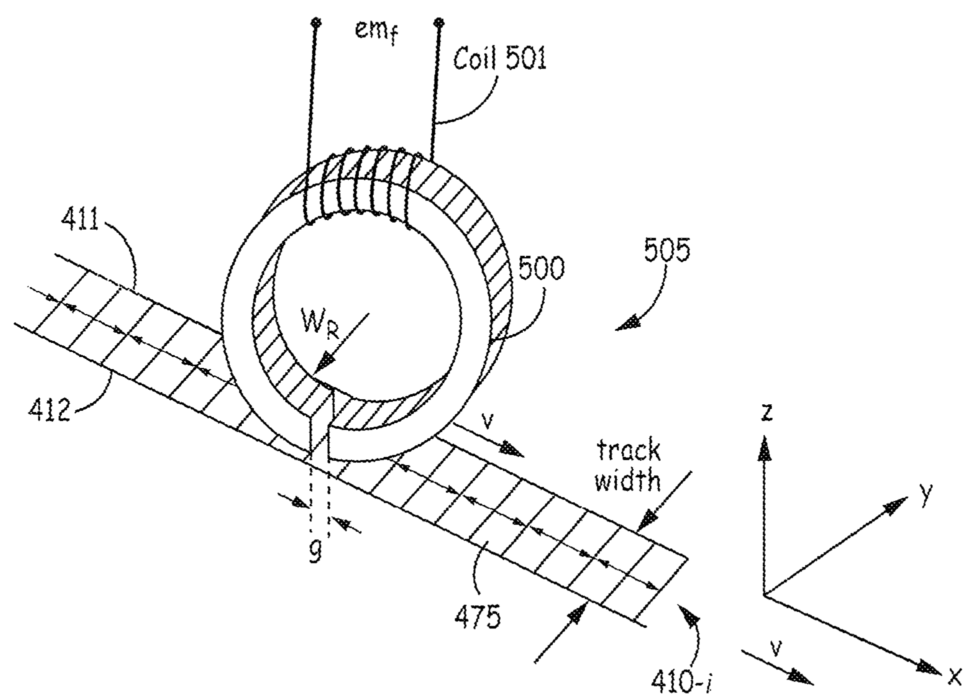
FIG. 3 is an oblique view of a prior art inductive reader.

Magnetic card reader devices, currently found at points of sale in retail stores, employ inductive readers to read the magnetic field 400 generated by the transitions 476-M between the magnetized bits 475-M and 475-(M+1), where M is a positive integer. FIG. 3 is an oblique view of a prior art inductive reader 505. The inductive reader 505 includes an inductive core 500 (head 500) wound with a wire coil 501. The inductive core 500 has a read width $W_R$ and a gap g. The gap g scans the magnetic fields 400 offset from a track 410-*i* in the downtrack direction at a velocity v. The width gap g of the inductive core 500 is comparable to transition length $L_t$ between adjacent $i^{th}$ and $(i+1)^{th}$ magnetic bits 475-*i* and 475 (*i*+1) (FIG. 1*i*). As the inductive reader 505 is traversed downtrack (in the +x direction) in near-contact with the magnetic track 410-*i* (i.e., within the magnetic fields 400), a readback emf is generated across the coil 501 due to changing flux through the inductive core 500. The magnetic strip 409, moving with a downtrack velocity represented generally by the arrow labeled v, is a single track 410-*i* that is read by the inductive reader 505 shown in FIG. 3.

The read width $W_R$ of the inductive head 500 is designed to be smaller than the track width $W_{track}$ of the magnetic track 410-*i*. This slop ensures the inductive reader 505 reads uniform magnetic fields in the central region of the magnetic track 410-*i*, even if the head 500 of the inductive reader 505 is offset in the y direction. As defined herein, the "central region of the magnetic track" is that region between the edges 411 and 412 (extending in the x-direction) of the written track 410-*i*.

The magnetic field 400 above the magnetic track 410-*i* from magnetized bit transitions 476(1-M) primarily consists of z-axis components and x-axis components. Above the central region of the written track, the y-component of the magnetic field 400 is nominally zero. The x, y, and z components of the magnetic field remain uniform as the magnetic strip 409 moves sideways (i.e., in the cross-track direction along the y-axis) away from the center line extending the length of the track 410-*i*. The magnetic field is not uniform above the track edges. The first track edge 411 and the second track edge 412 are shown in FIGS. 1 and 3. There are also track edges (not shown) between tracks 410-1 and 410-2, between tracks 410-2 and 410-3. In an embodiment with only one track 410, as shown in FIG. 3, there are only two track edges 411 and 412.

Figure 4:
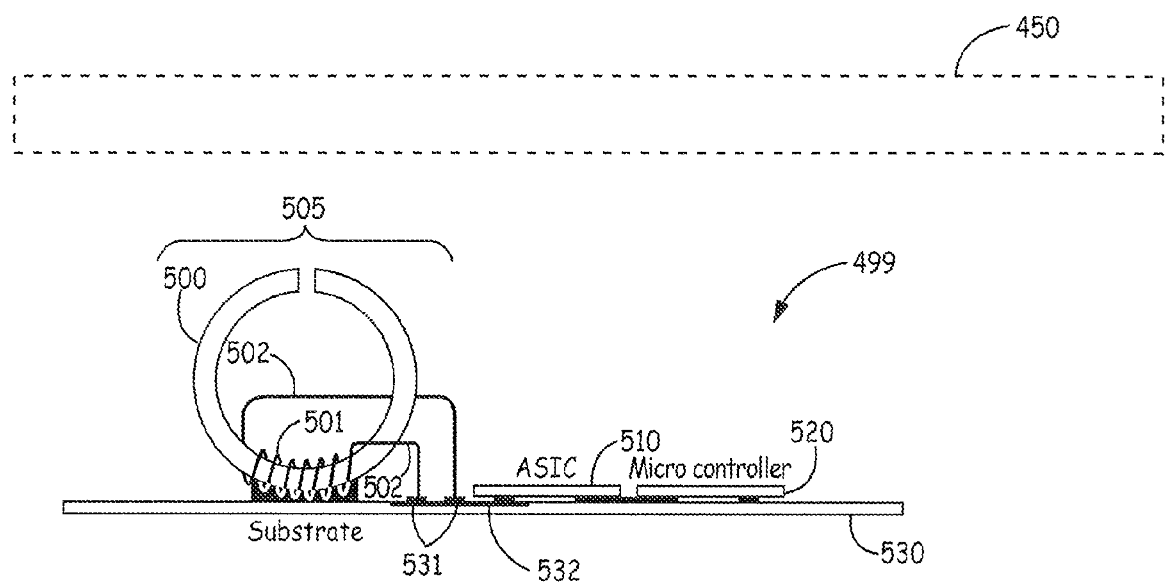
FIG. 4 shows an embodiment of a prior art inductive reader attached to an application-specific integrated circuit (ASIC) on a substrate in a currently available card reader device.

FIG. 4 shows an embodiment of a prior art inductive reader 505 attached to an application-specific integrated circuit (ASIC) 510 on a substrate 530 in a currently available magnetic card reader device 499. The inductive reader 505 is also referred to as an "inductive head reader" and includes the inductive core 500 wound with the wire coil 501. The magnetic card reader device 499 is also referred to herein as a "magnetic card reader assembly 499". The magnetic card reader assembly 499 is shown upside down so a magnetic card 450 to be read would be above the magnetic card reader assembly 499 (shown as a dashed outline 450). The operation of the inductive reader 499 is illustrated in FIG. 3.

The emf developed across the inductive reader 505 is given by the following formula.

$$\text{emf}(t) = Av\frac{dH_x}{dx}, \quad (1)$$

where A is a constant of proportionality that is a function of the magnetic properties of the inductive core 500 and geometrical parameters of the inductive core 500 and coil 501, v is the downtrack velocity, and $H_x$ is the downtrack field emanating from the written medium in the gap g of the inductive core 500.

The card reader device 499 shown in FIG. 4 further processes the output of the inductive readers 505. The output of the inductive reader 505 is amplified, digitized, encrypted, and transmitted to servers. In one implementation of this embodiment, an application-specific integrated circuit (ASIC) 510 and a microcontroller 520 are communicatively coupled to the coil 510 to read the track 410. The ASIC 510 and a microcontroller 520 are shown in FIG. 4 as solid state chips. The wires 502 that transmit the reader signal are attached to pads 531 on the substrate 530. The pads 531 are communicatively coupled to the ASIC 510 via the substrate connectors 532. The remaining functions of amplification, digitization, transmission and control, etc., are internal to the solid state chips 510 and 520. Connections between the integrated circuits (such as, ASIC 510 and a microcontroller 520) can be made using substrate connectors 532.

The points of attachment of the wires 502 to pads 531 on the substrate 530 are a weak point from a security point of view. This point in the magnetic card reader device 499 is susceptible to being broken into (e.g., tapped) so that the raw signal from the reader is read by unwanted agencies. Other connections, e.g., between the ASIC 510 and microcontroller 520 can be made using connectors on (or above) the surface of substrate 530 and are more secure.

The security problem with inductive readers in magnetic card reader devices 499 described above is resolved by the embodiments of the solid state magnetic sensors described herein. The magnetic card reader devices that employ the solid state magnetic sensors described herein are less susceptible to being broken into by unwanted agencies, who want to read a raw signal from a magnetic sensor.

The solid state magnetic sensors described herein for sensing magnetic tracks include at least one half of a Wheatstone bridge including at least two legs. Each of the at least two legs include at least a portion of a strip of magnetic material. An inner gap between parallel and adjacent strips of a respective at least two legs is on the order of a transition length on a magnetic track to be sensed (read). The solid state magnetic sensors described herein also include barber pole nonmagnetic shorting bars arranged on the portions of the strip of magnetic material from which the at least two legs of the at least one half of the Wheatstone bridge are formed. In a simplest embodiment, a leg of the full-Wheatstone bridge or the half-Wheatstone bridge includes a single strip of magnetic material. In one implementation of this embodiment, a leg of a half-Wheatstone bridge includes two or more strips of magnetic material. In another implementation of this embodiment, a leg of a full-Wheatstone bridge includes two or more strips of magnetic material.

Figure 5A:
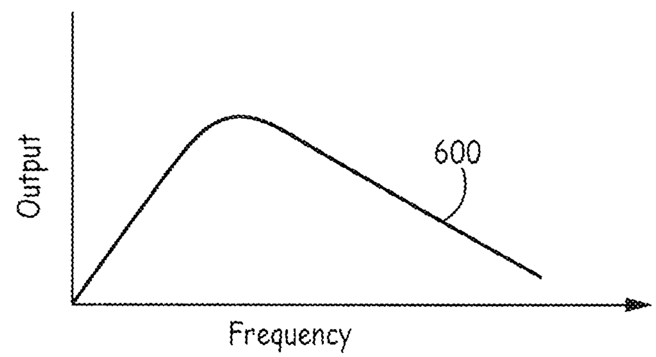
FIG. 5A shows a general form of the output of the prior art inductive reader of FIG. 4 in the frequency domain.

FIG. 5A shows a general form of the output 600 of the prior art inductive reader 505 of FIG. 4 in the frequency domain. The shape of the plot shown in FIG. 5A is suggestive and is not from an actual measurement. The velocity term v in equation 1 means that, in the frequency domain, the output of an inductive reader goes to zero as one approaches DC frequencies (i.e., as the velocity of the scan goes to zero). At high frequencies, the output again decreases because of the decreasing signal content in the field gradient $dH_x/dx$.

Figure 5B:
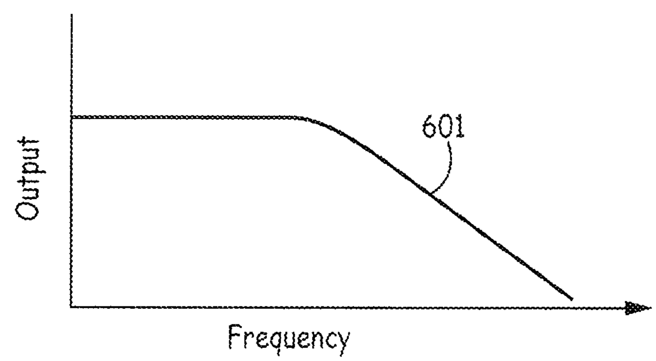
FIG. 5B shows a general form of a magneto resistive (MR) sensor output in the frequency domain in accordance with the present invention.

FIG. 5B shows a general form of a magneto resistive (MR) sensor output in the frequency domain in accordance with the present invention. The shape of the plot shown in FIG. 5B is suggestive and is not from an actual measurement. In comparison to the output 600 of a prior art inductive reader, the output 601 from an MR reader is flat and greater than zero down to DC frequency. At high frequencies, the output 601 decreases for the same reason as for the inductive reader 505 (FIG. 4). The additional signal power present at lower frequencies in the readers including MR sensors can be used to advantage in the sensors described herein. Thus, the frequency dependence of the solid state magnetic sensors (i.e., magneto resistive (MR) sensors) described herein are better for use in magnetic card reader devices since the output of the solid state magnetic sensor does not go to zero at low scan speeds of a magnetic card 450 (FIG. 1).

Figure 6:
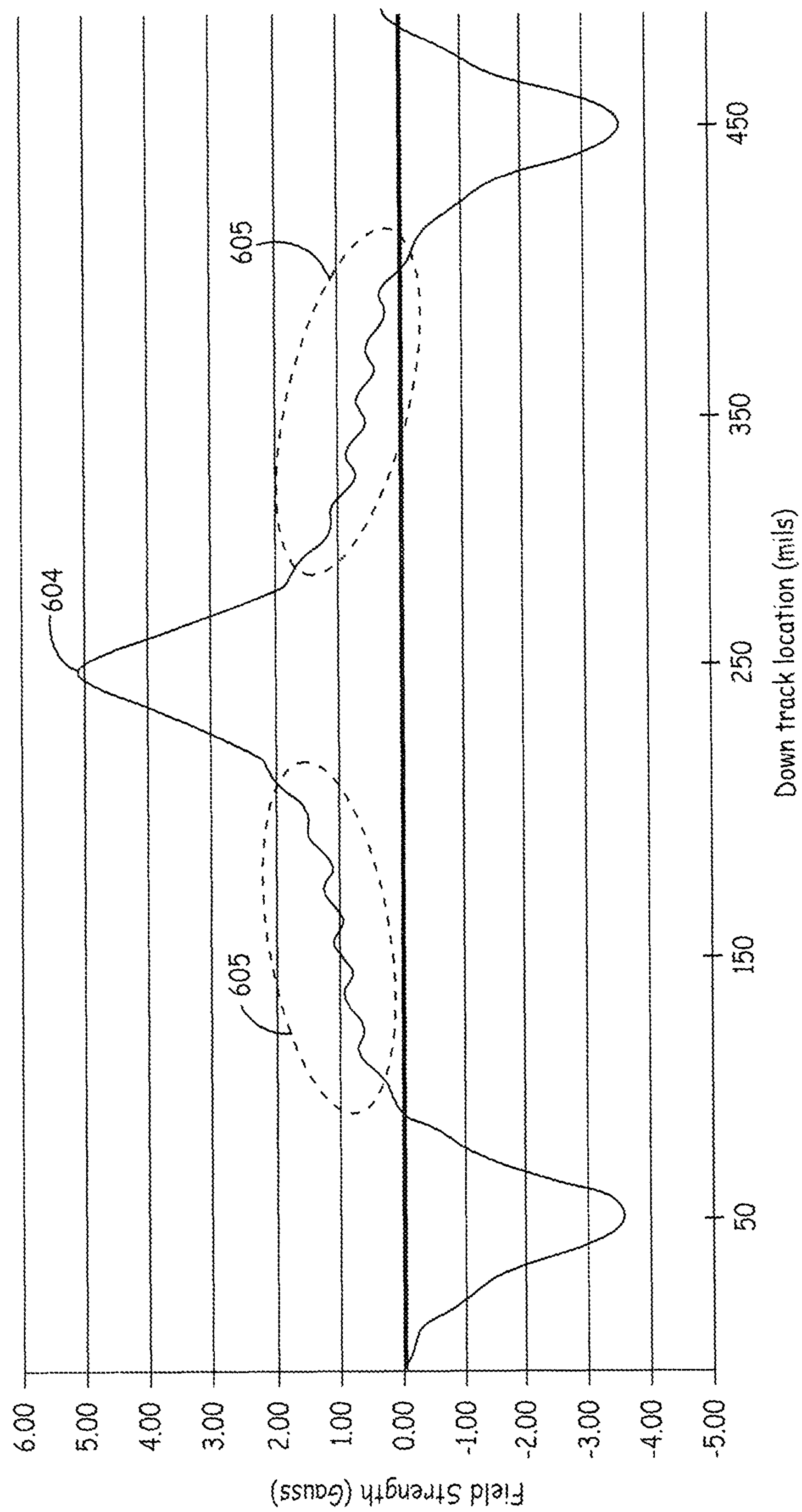
FIG. 6 shows an exemplary z-axis magnetic field read above a portion of an exemplary written track.

FIG. 6 shows an exemplary z-axis magnetic field read above a portion of an exemplary written track 410. FIG. 6 shows the magnetic z-field as the magnetic head is moved above a transition 476 between the magnetized bits 475 (FIG. 1 *i*) while held at a constant distance in the z direction above the surface of the exemplary written track 410. The magnetic field peaks at region 604 when the magnetic head is above a transition (e.g., 476-1 in FIG. 1*i*) between the magnetized bits (e.g., 475-1 and 475-2 in FIG. 1*i*). Noise patterns 605 are seen on either side of the peak region 604 between the transitions 476-1. As defined herein, the "z-field" is the magnetic field oriented along the z-axis. The "z-field" is also referred to herein as "z-axis field", and "z-axis magnetic field". The gradient of the z-field is the "z-axis magnetic field gradient".

A measurement of the x-field (e.g., the downtrack field) has the same type of profile. As defined herein, the "x-field" is the magnetic field oriented along the x-axis. The "x-field" is also referred to herein as "x-axis field", and "x-axis magnetic field". The gradient of the x-field is the "x-axis magnetic field gradient". Magnetic fingerprinting (described below) can be performed using the z-field or the x-field by the integrated cards readers described herein.

Noise patterns 605 such as those shown in FIG. 6 are specific to a card, and two different cards will have different noise patterns. Such specificity of noise patterns 605 has been used to advantage for security purposes that is described as "fingerprinting" a card. Several patents including U.S. Pat. No. 5,546,462 by Indeck, et al., U.S. Pat. No. 5,740,244 by Indeck, et al., and U.S. Pat. No. 7,377,433 by Morley, Jr. et al. describe fingerprinting based on the specificity of noise patterns 605. Noise patterns from a card are stored (typically on a server) in advance of using the credit card.

At the point of sale the noise patterns 605 are read and a correlation coefficient between just-read noise pattern and stored noise patterns is calculated. The correlation coefficient for the same card tends to be high. If a credit card (magnetic track) is duplicated, based on tampering of the original credit card (magnetic track), the duplicated credit card will not have the same noise pattern as the original credit card. Thus, since the correlation coefficient for an original and duplicated card tends to be low, the magnetic sensors provide output used to determine whether the credit card is duplicated in a theft. Thus, magnetic fingerprinting provides additional validation of a card. U.S. Pat. No. 7,377,433 by Morley, Jr. et al., indicates that the correlation coefficient for different cards, as measured in prior art systems, is less than 0.1, while the correlation coefficient for the same card is greater than 0.2.

In order for a sensor to read the transition peaks and the noise patterns, the sensor must have a wide dynamic range.

The anisotropic magneto-resistance (AMR) sensors described herein are sensitive and have minimum detectable field of less than 100 μG. The anisotropic magneto-resistance (AMR) sensors described herein have a wide field range (i.e., greater than 10 G). Such dynamic range is sufficient to detect both the transitions and the noise patterns. Thus, the AMR sensors described herein are useful for fingerprinting.

Figure 7:
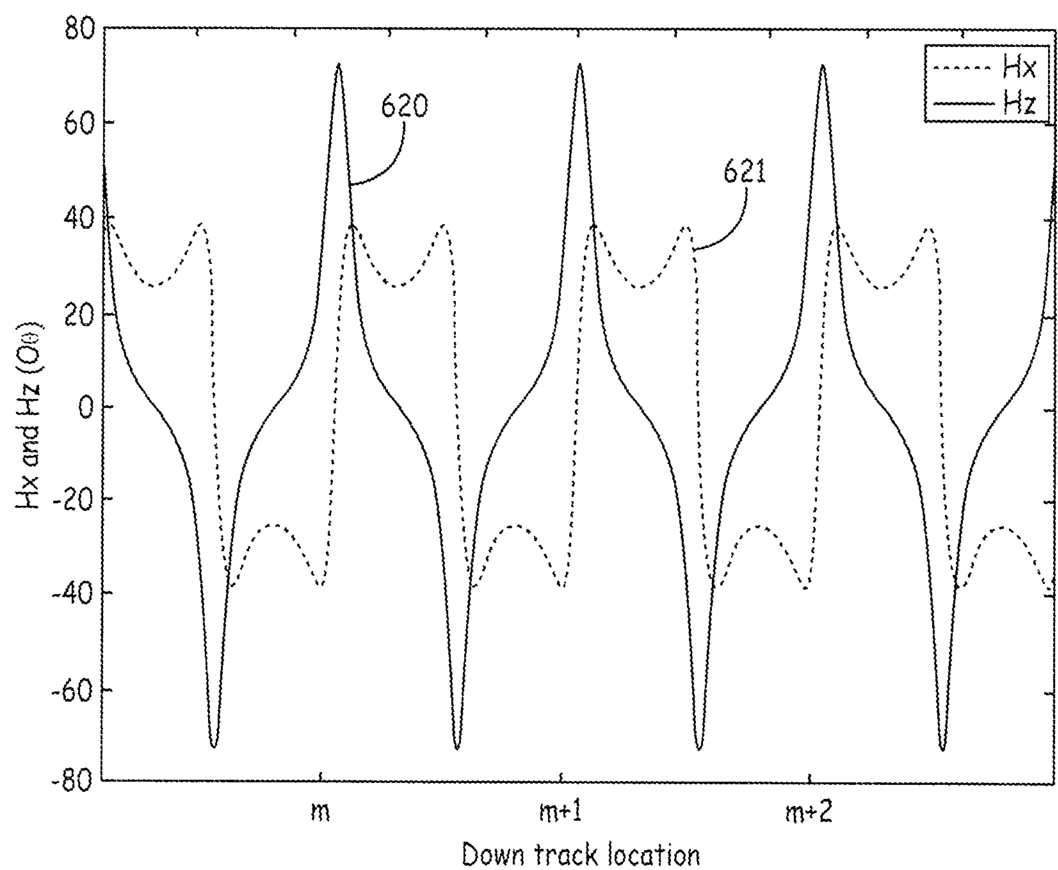
FIG. 7 shows calculated z-axis magnetic fields and x-axis magnetic fields above the track center from a mathematical model of transitions on a written track.

FIG. 7 shows calculated z-axis magnetic fields and x-axis magnetic fields above the track center from a mathematical model of transitions on a written track 410 above the track center. The $m^{th}$ transition, the $(m+1)^{th}$ transition, and the $(m+2)^{th}$ transition are shown on the horizontal axis with the labels m, m+1, and m+2, respectively. The z-axis magnetic field represented generally at 620 (solid line) has a peak above a transition, and the x-axis magnetic field represented generally at 621 (dashed line) has a sharp gradient above a transition.

Figure 8:
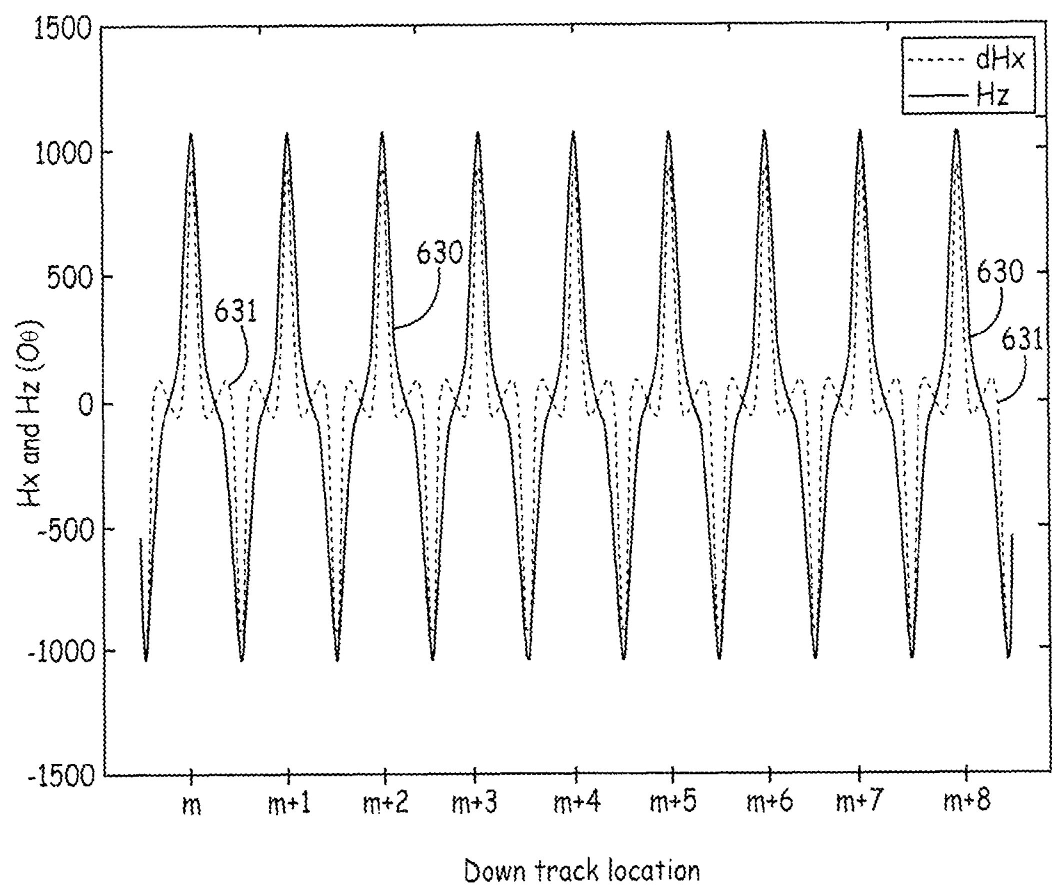
FIG. 8 shows a calculated z-axis magnetic field and x-axis magnetic field gradient above the track center from a mathematical model of transitions on a written track.

FIG. 8 shows a calculated magnetic z-axis magnetic field and x-axis magnetic field gradient above the track center from a mathematical model of transitions on a written track 410. The z-axis magnetic field is represented generally at 630 (solid line) and the x-axis magnetic field gradient is represented generally at 631 (dashed line) above the track center. The bit density in FIG. 7 is less than the bit density in FIG. 8, hence the downtrack distance between the $m^{th}$ transition and the $(m+1)^{th}$ transition is greater in FIG. 7 than in FIG. 8. One can also calculate z-gradient of z-field (not shown).

The AMR sensors described herein make it possible to read gradients of fields (or other components) from the transitions. The x-field or z-field may offer an advantage of higher field strength. In one implementation of this embodiment, packaging of the magnetic card reader is arranged to allow one or more AMR sensors to be oriented advantageously along one of these directions. In another implementation of this embodiment, packaging of the magnetic card reader is arranged to allow AMR sensors to be oriented advantageously along both of these directions. In yet another implementation the AMR sensors described herein measure a field and its gradient simultaneously thereby providing additional information about the transition and noise pattern between transitions.

Figure 9:
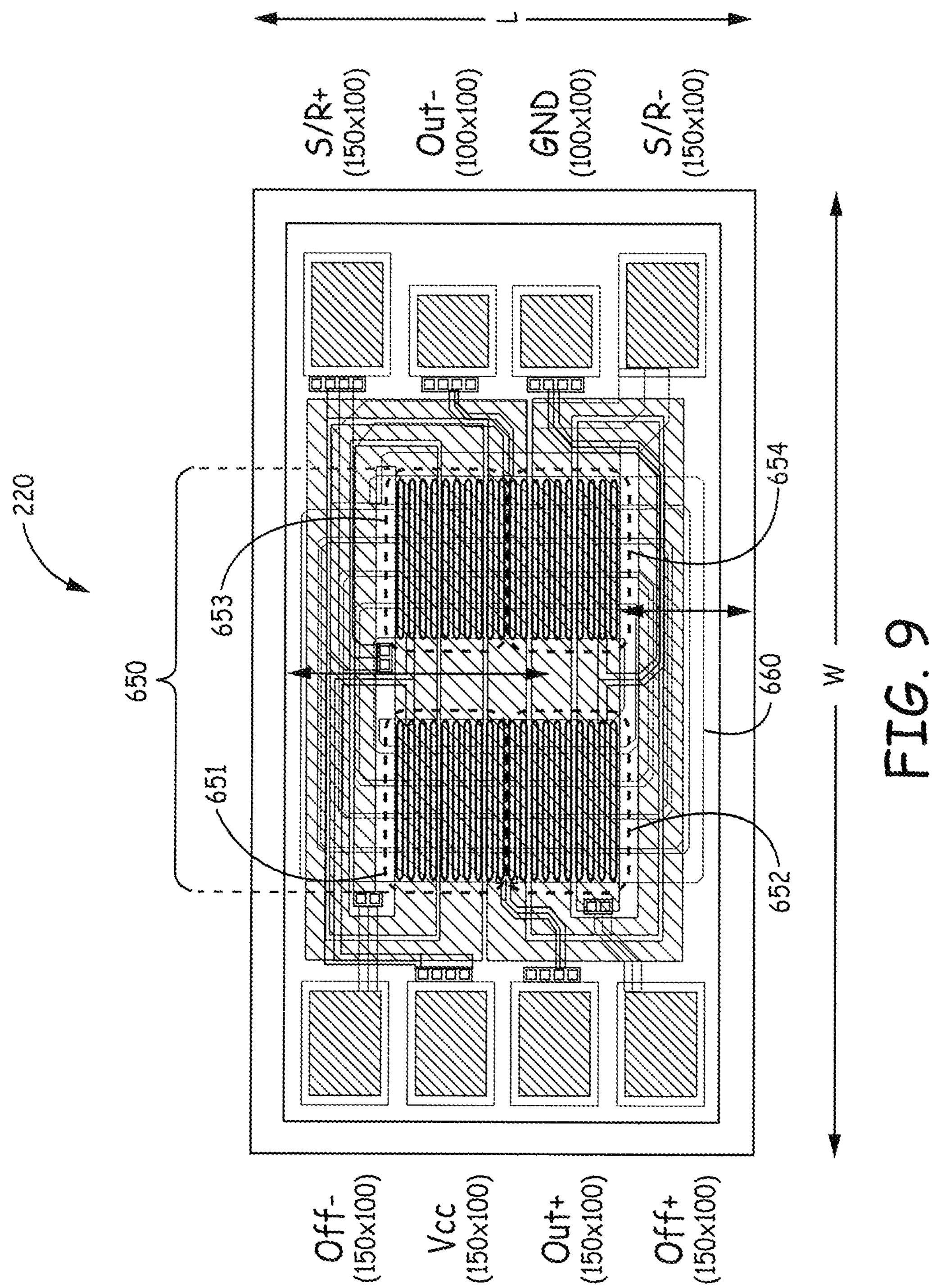
FIG. 9 shows an Anisotropic Magneto-Resistance (AMR) sensor in accordance with the present invention.

FIG. 9 shows an Anisotropic Magneto-Resistance (AMR) sensor 220 in accordance with the present invention. The AMR sensor 220 of FIG. 9 is a silicon sensor 220 designed for sensing fields with resolution less than a 100 microGauss and a dynamic range of approximately 10 Gauss. The AMR sensor 220 consists of a full-Wheatstone bridge 650 with four legs 651-654 having a total resistance of about 1 kOhm. Each leg 651-654 of the full-Wheatstone bridge 650 is several hundred microns in dimension. Also shown are set-reset straps 660, also referred to herein as setting structure 660. The set-reset straps 660 magnetize the legs 651-654 of the full-Wheatstone bridge 650 along their long dimension (parallel to the line W shown in FIG. 9) with a short current pulse. The set-reset straps 660 are used to: 1) initialize the AMR sensor 220 for sensing; 2) re-initialize AMR sensor 220 after a real or likely instance of demagnetization; and/or 3) to set the magnetization of the AMR sensor 220 along one direction, and to then reset the magnetization of the AMR sensor 220 in the opposite direction. This latter use of the set-reset straps 660 takes the difference between the two readings in order to remove the null offset of the AMR sensor 220.

The AMR sensor 220 shown in FIG. 9 is well suited for the credit card reader application and for detecting the noise patterns 605 (FIG. 6) between the transitions 476-1 (FIG. 1*i*). The resolution, dynamic range, resistance, and the AMR sensor's natural length scale are of the right order of magnitude for detecting the noise patterns 605 (FIG. 6) between the transitions 476-1 (FIG. 1*i*). A magnetic track reader or credit card reader can be developed using the base AMR technology such that a single sensor will cover the central region of the magnetic track with the requisite resolution and dynamic range. By contrast, other magnetoresistance technologies, e.g., giant magnetoresistance (GMR) and tunnel magnetoresistance (TMR), are of a micron length scale and require a plurality of magnetic sensors to cover the central region of the written tracks 410 (FIG. 1).

Various additional embodiments of solid state magnetic sensor including AMR magnetometers and AMR gradiometers, alone or in combination, are now described. The embodiments of the solid state magnetic sensors for reading magnetic information on a magnetic card described herein include at least one half of a Wheatstone bridge. The at least one half of the Wheatstone bridge includes at least two legs. Each of the at least two legs is formed by at least a portion of a strip. The solid state magnetic sensors include an inner gap between parallel and adjacent strips of a respective at least two legs. The inner gap is on the order of a transition length on a magnetic track to be sensed, e.g., on the magnetic card to be read. Barber pole nonmagnetic shorting bars are arranged on the at least two strips of the least one half of the Wheatstone bridge. The solid state magnetic sensor is an AMR magnetometer, an AMR gradiometer, or a combined AMR magnetometer/gradiometer based on the orientation of the barber pole nonmagnetic shorting bars on the strips that form the legs.

Figure 10:
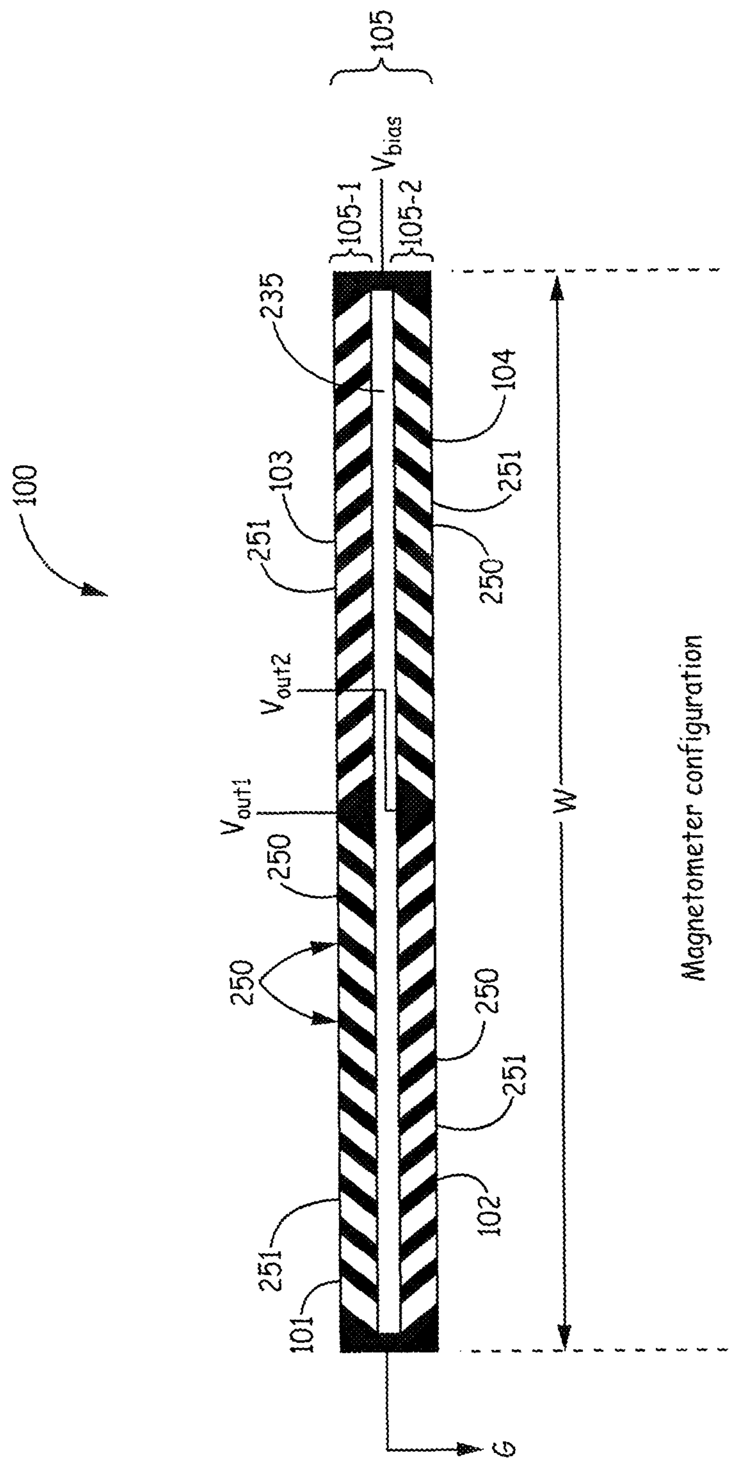
FIG. 10 shows an Anisotropic Magneto-Resistance (AMR) sensor in a magnetometer configuration tailored to a credit card application in accordance with the present invention.

FIG. 10 shows an Anisotropic Magneto-Resistance (AMR) sensor 100 in a magnetometer configuration tailored to a credit card application in accordance with the present invention. In FIG. 10, the AMR sensor 100 is a full-Wheatstone bridge 105 with four legs 101, 102, 103, and 104. The legs 101 and 103 as well as legs 102 and 104 have a width represented generally at W. The four legs 101, 102, 103, and 104 are referred to herein as "bridge-legs 101, 102, 103, and 104" or are referred to individually as first leg 101, second leg 102, third leg 103, and fourth leg 104. Each bridge-leg 101, 102, 103, and 104 includes a magnetic material represented generally at 251 that is visible behind barber pole nonmagnetic shorting bars represented generally at 250. The magnetic material 251 is also referred to herein as "strip 251" or "strip of magnetic material 251" due to its elongated rectangular shape or serpentine shape. In one implementation of this embodiment, the magnetic material 251 is a permalloy (NiFe). In another implementation of this embodiment, the magnetic material 251 is a transition metal alloy. In some embodiments, transition metal alloy is an alloy of transition metals Fe, Co, and/or Ni.

The "barber pole nonmagnetic shorting bars 250" are also referred to herein as "barber pole shorting metal bars 250" and "barber pole shorting bars 250". The barber pole nonmagnetic shorting bars 250 create a linear sensor.

First leg 101 and third leg 103 are on opposite ends (i.e., a first portion and a second portion) of a first strip 105-1. First leg 101 and third leg 103 are distinguished from each other by a different (i.e., a mirror image) orientation of the barber pole nonmagnetic shorting bars 250. Likewise, second leg 102 and fourth leg 104 are on opposite ends (i.e., a first portion and a second portion) of a second strip 105-2 and are distinguished from each other by a different (i.e., a mirror image) orientation of the barber pole nonmagnetic shorting bars 250. An inner gap 235 between first strip 105-1 and the parallel and adjacent second strip 105-2 is on the order of the length of the transitions 476-1, 476-2, and 476-3 (FIG. 1*i*) (i.e., the transition length $L_t$) on a magnetic track 410 to be sensed (e.g., on the magnetic card 450 to be read). Thus, the first leg 101 and second leg 102 are separated by the inner gap 235 and the third leg 103 and fourth leg 104 are separated by the inner gap 235.

There are several important features required for a credit card sensor: 1) the inner gap 236 between the legs 101 and 102 and between legs 103 and 104 must be of the order of the transition length $L_t$; 2) the total x dimension of the sensors active region (in the downtrack direction) must be less than the closest distance between transitions; and 3) the sensor crosstrack width in the y direction is designed to be smaller than the trackwidth $W_{track}$.

The inner gap 235 can be varied based on the capability of the photolithography process used to form the device. In one implementation of this embodiment, the inner gap 235 is ~10 micron.

The extent of AMR sensor 100 in the y direction (W) spans a large fraction of the track width $W_{track}$ (FIG. 1). In one implementation of this embodiment, the width W of sensor 100 is 1.4 mm, and is designed to sense the central portion of a 3 mm wide track. The width W can be adjusted as needed to reduce sensor cost. The full-Wheatstone bridge 105 is fabricated on silicon wafer using standard semiconductor and magnetic deposition processes as is known to one skilled in the arts. The fabrication process is, therefore, not elaborated upon herein. The full-Wheatstone bridge 105, as shown in FIG. 10, is biased with a constant bias voltage $V_{bias}$. The differential voltage between the output nodes of the bridge (e.g., $V_{out1}$ and $V_{out2}$) is a function of an applied magnetic field.

Figure 11:
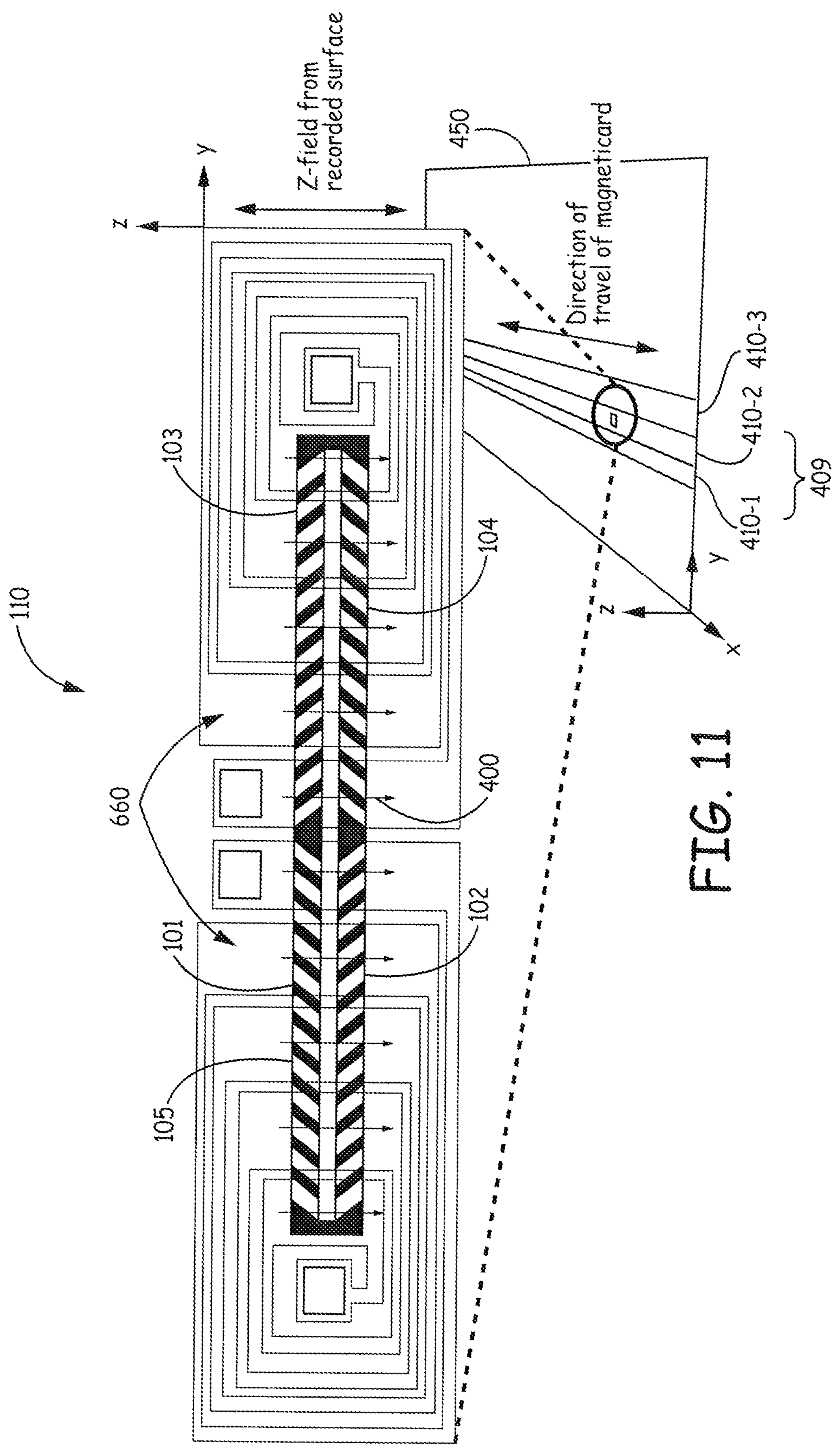
FIGS. 11 and 12 show embodiments of AMR sensors for sensing the z-axis field above a written track in accordance with the present invention.
Figure 12:
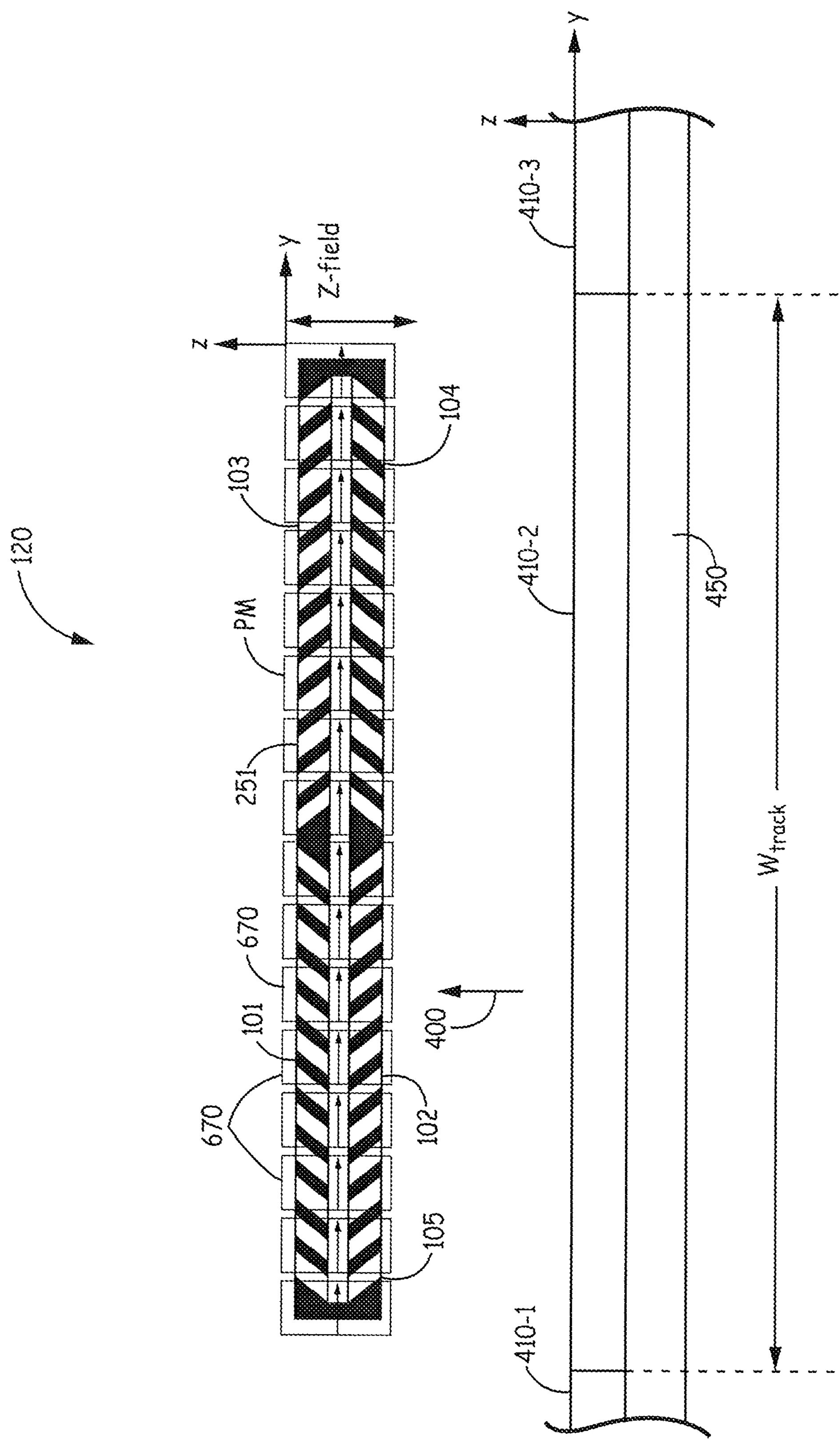

FIGS. 11 and 12 show embodiments of AMR sensors 110 and 120, respectively, for sensing the z-axis field above a written track 410 in accordance with the present invention. Specifically, the configuration of the sensors 110 and 120 shown in FIGS. 11 and 12, respectively, include a setting structure, which produces a bias field at the AMR sensors 110 and 120, and which is used for stabilizing the magnetization in the sensor legs 101-104 prior to reading the magnetic field or magnetic field gradient. The sensors 110 and 120, as shown in FIGS. 11 and 12, respectively, are in the y-z plane and are operational when perpendicular to the surface (the x-y plane) of the credit card 450 being scanned. When positioned in such a manner, the sensors 110 and 120 read the magnetic z-field that is generated by the magnetic written track 410-1 (FIG. 11).

The configuration of the sensor 110 in FIG. 11 shows the sensor 100 with set-reset straps 660 that are used as the setting structure. The set-reset straps 660 magnetize the legs 101, 102, 103, and 104 of the full-Wheatstone bridge 105 along their long dimension (parallel to the y axis shown in FIG. 11) with a short current pulse. The AMR sensor 110 in FIG. 11 is used to detect the z-field from a credit card track 410-2. This sensor uses set-reset strap 660 to initialize the magnetization along the long dimension of the bridge-legs 101-104.

The configuration of the sensor 120 in FIG. 12 shows a sensor 120 with permanent magnets (PM) 670 positioned either above or below the transition metal of the full-Wheatstone bridge. In this embodiment, the permanent magnets 670 are the setting structures. This sensor 120 includes a linear array (1×P), where P is a positive integer, of magnetized permanent magnets 670 positioned either above or below the four legs bridge-legs 101-104 (i.e., above or below the transition metal alloy). In one implementation of this embodiment, the permanent magnets 670 are fabricated on a layer below the layer of transition metal alloy. In another implementation of this embodiment, the permanent magnets 670 are fabricated on a layer above the layer of transition metal alloy. The permanent magnets 670 supply a bias magnetic field to the sensor 120 in place of set-reset strap 660 shown in FIG. 11.

Both the set-reset strap 660 and the permanent magnets 670 are designed to produce a bias field, either temporary or permanent, resulting in uniform magnetization along the long dimension of the bridge-legs 101-104 used for sensing the magnetic fields represented generally at 400. The configuration of the AMR sensor 120 in FIG. 12 enables the edge of the AMR sensor 120 to be closer to the written track 410 than the AMR sensor 110 in FIG. 11. The spacing between the written track and the edge or surface of the AMR sensor for sensing the z-axis field or x-axis field, respectively, is referred to herein as sensor-to-medium spacing. The sensor-to-medium spacing is an important parameter in magnetic recording. For credit card applications, the sensor-to-medium spacing is held to within a few microns in order to differentiate neighboring transitions.

Figure 13:
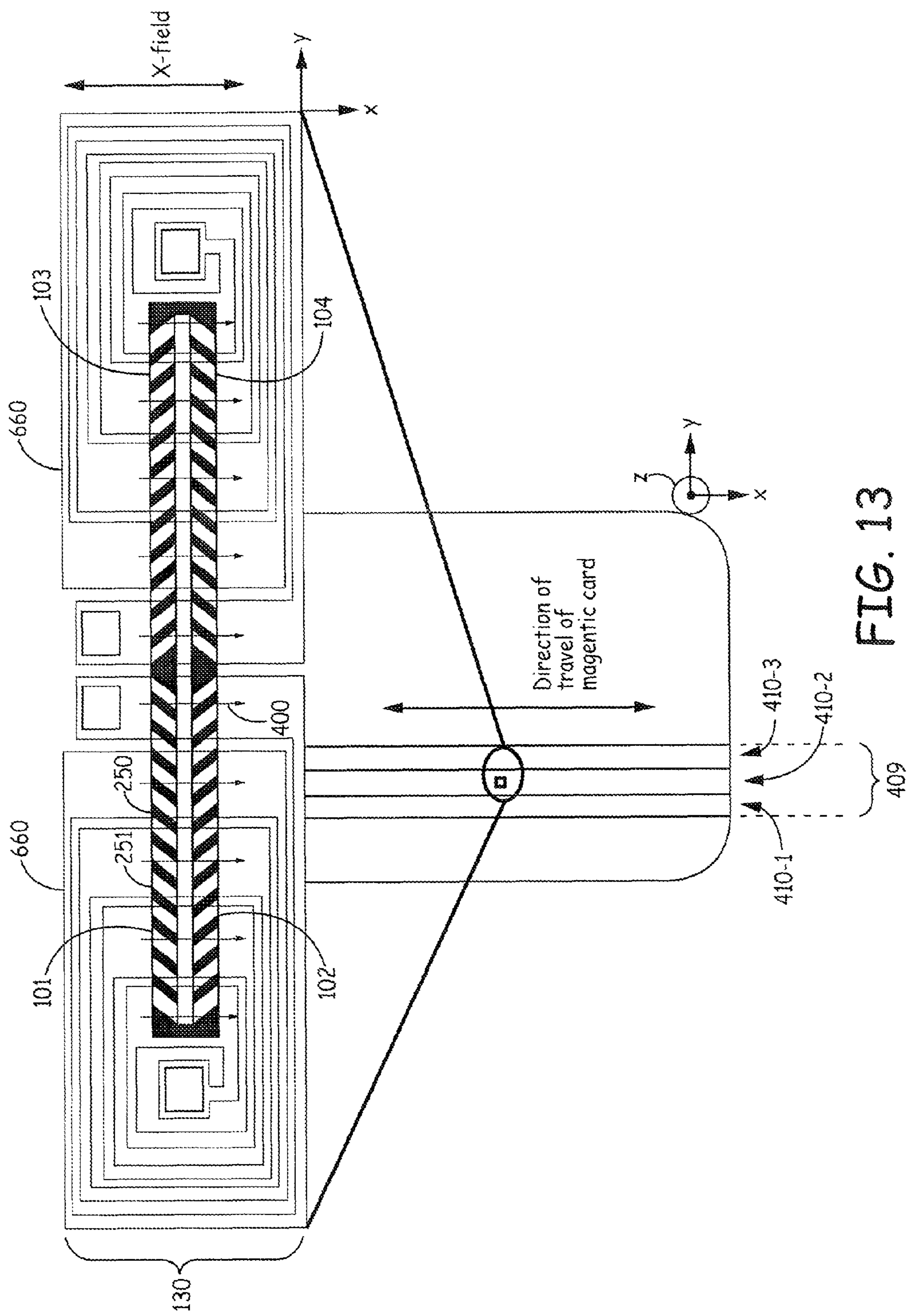
FIG. 13 shows a configuration of a magnetometer used for sensing x-axis field above a written track in accordance with the present invention.

FIG. 13 shows a configuration of a magnetometer 130 (AMR sensor 130) used for sensing the x-axis field above a written track 410 in accordance with the present invention. The AMR sensor 130 is used to detect the x-field from a credit card track 410. The AMR sensor 130 is similar in structure to the AMR sensor 110 of FIG. 11. The AMR sensor 130 is oriented in the x-y plane parallel to the x-y plane of the recorded surface 410. The sensitive direction of the sensor 130 is parallel to the downtrack direction (x direction). For clarity, the sensor 130 is shown with the active face up (i.e., upside-down). The sensing surface of the AMR sensor 130, in operation, faces the recorded surface 410. In an x-axis sensor, the sensor to recorded-medium spacing is less than in the z-axis sensor 110 (FIG. 11), since the x-axis sensor, unlike the z-axis sensor 110, does not have any portion of the set-reset strap 660 between the x-axis sensor and the recorded surface 410.

In one implementation of this embodiment, the AMR sensor 130 is similar in structure to the AMR 120 of FIG. 12 and includes the permanent magnets.

The output of the magnetometer configuration of the AMR sensor 130 is given by:

$$V_{out}(t)=SH_iV_{bias}, \quad (2)$$

where the subscript i=x, or z, S is the sensitivity of the magnetometer (units: Volt/Volt-Oe), $H_i$ is the field component (units: Oe), and $V_{bias}$ is the sensor bias voltage. The details of the medium and sensor-medium spacing are subsumed in $H_i$, and the details of sensor design are subsumed in the sensitivity parameter S. S is a function of $H_i$; for low fields $H_i$, S is a constant, i.e., $S(H_i)\rightarrow S$.

Figures 14A, 14B:
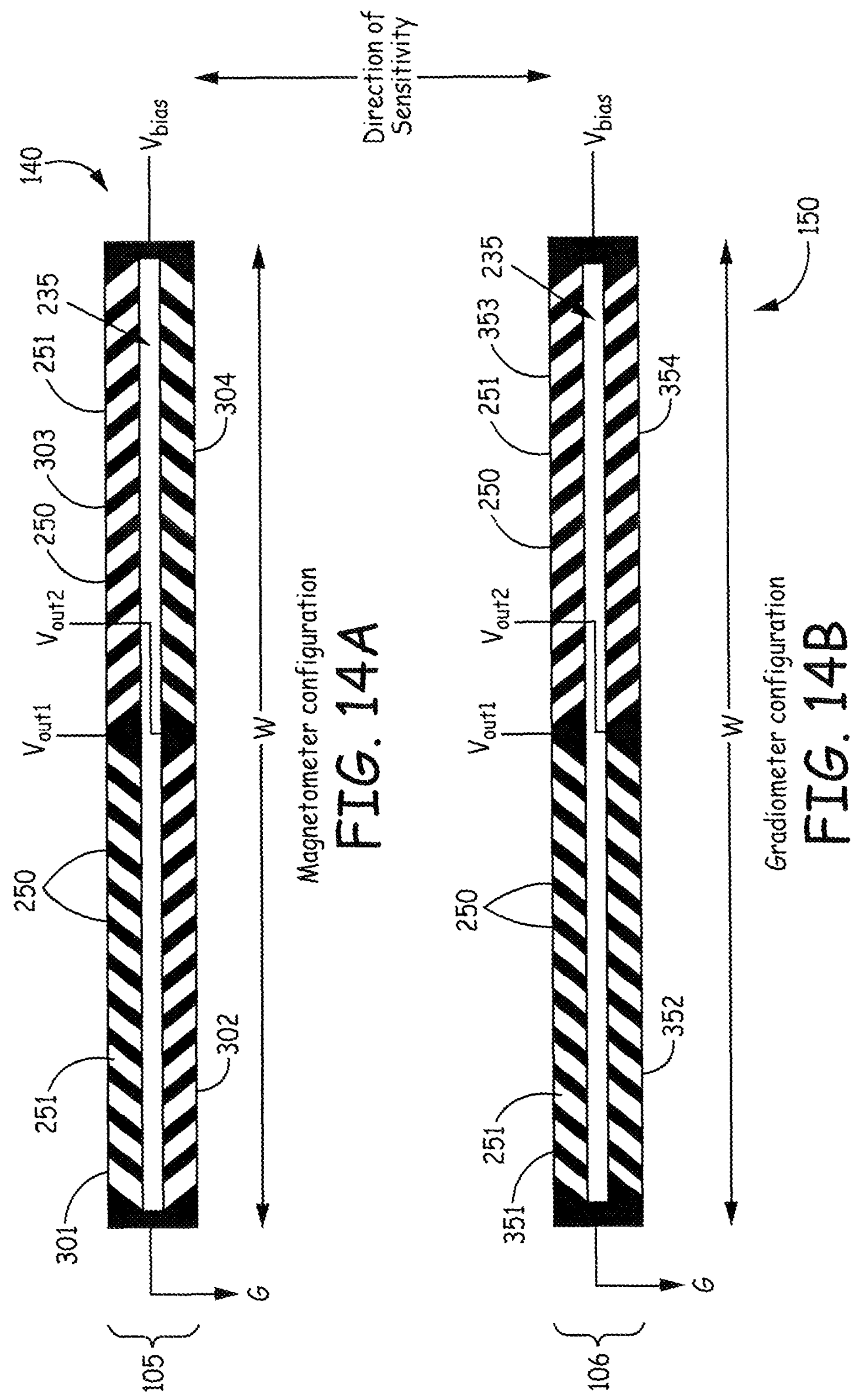
FIG. 14A shows a configuration of a magnetometer used for sensing a magnetic field above a written track in accordance with the present invention.
FIG. 14B shows a configuration of a gradiometer used for sensing a gradient of a magnetic field above a written track in accordance with the present invention.

The configurations of the AMR sensors 220, 110, 120, and 130 described above with reference to FIGS. 9, 11, 12, and 13, respectively, are configured as magnetometer sensor. Each of the AMR sensors 220, 110, 120, and 130 is able to be redesigned to operate in a gradiometer sensor configuration. FIG. 14A shows a configuration of a magnetometer 140 used for sensing a magnetic field above a written track 410-*i* in accordance with the present invention. FIG. 14B shows a configuration of a gradiometer 150 used for sensing a gradient of a magnetic field above a written track 410-*i* in accordance with the present invention.

As shown in FIG. 14A, the AMR magnetometer sensor 140 includes a full-Wheatstone bridge 105 (FIG. 10). As shown in FIG. 14B, the gradiometer 150 (AMR gradiometer sensor 150) includes a full-Wheatstone bridge 106. As shown in FIGS. 14A and 14B, the full-Wheatstone bridge 105 of the AMR magnetometer sensor 140 and the full-Wheatstone bridge 106 of the AMR gradiometer sensor 150 differ in the orientation of the barber pole shorting metal bars 250 on the magnetic strips 251. The barber pole shorting metal bars 250 are used to achieve a linear response of the sensor 140 or 150. The change in orientation of the barber pole shorting metal bars 250 does not change the other parameters defining the sensors 140 and 150, e.g., resolution, dynamic range, resistance, and in particular, the inner gap between two halves of the sensor.

As shown in FIG. 14A, in the AMR magnetometer sensor 140 the relative orientation of the barber pole shorting metal bars 250 on the first leg 301 and on the second leg 302 are flipped about the long extent (i.e., perpendicular to the direction of sensitivity) of the AMR magnetometer sensor 140. The relative orientation of the barber pole shorting metal bars 250 on the third leg 303 and on the fourth leg 304 are also flipped about the long extent of the AMR magnetometer sensor 140. The relative orientation of the barber pole shorting metal bars 250 on the first leg 301 and on the third leg 303 are flipped about the narrow extent (i.e., parallel to the direction of sensitivity) of the AMR magnetometer sensor 140. The relative orientation of the barber pole shorting metal bars 250 on the second leg 302 and on the fourth leg 304 are flipped about the narrow extent of the AMR magnetometer sensor 140.

As shown in FIG. 14B, in the AMR gradiometer sensor 150 the relative orientation of the barber pole shorting metal bars 250 on the first leg 351 are the same as the orientation of the barber pole shorting metal bars 250 on the second leg 352. In the AMR gradiometer sensor 150, the relative orientation of the barber pole shorting metal bars 250 on the third leg 353 are the same as the orientation of the barber pole shorting metal bars 250 on the fourth leg 354. The relative orientation of the barber pole shorting metal bars 250 on the first leg 351 and on the third leg 353 are flipped about the narrow extent of the AMR gradiometer sensor 150. The relative orientation of the barber pole shorting metal bars 250 on the second leg 352 and on the fourth leg 354 are flipped about the narrow extent of the AMR gradiometer sensor 150.

The AMR gradiometer sensor 150 configured as illustrated in FIG. 14B can be used with a set-reset strap or a permanent magnet. It can be used as z-field gradient sensor ($dH_z/dz$), or x-field gradient sensor ($dH_x/dx$). One can replace the magnetometer configurations in FIGS. 11, 12, and 13 with a gradiometer configuration by changing the orientation of the barber pole shorting metal bars 250 as shown in FIG. 14B.

It is to be noted that, except for the velocity term, the output of the x-field gradiometer ($dH_x/dx$) is closely related to that of the prior art inductive reader 505 shown in FIG. 3. The x-field gradiometer ($dH_x/dx$) is obtained by replacing the magnetometer configuration of FIG. 13 with a gradiometer shown in FIG. 14B. That is, $$V_{out}(t) = S_g \frac{dH_x}{dx} V_{bias}, \tag{3}$$

where $S_g$ is the sensitivity of the gradiometer (units: Volt-micron/Volt-Oe), $dH_x/dx$ is the field gradient (units: Oe/micron), and $V_{bias}$ is the sensor bias voltage. All the details of the medium and sensor-medium spacing are subsumed in $dH_x/dx$, and all the details of sensor design are subsumed in the sensitivity parameter $S_g$. Since the output does not depend on the velocity of the reader with respect to the medium, there is far more signal content at low frequencies compared to the prior art inductive reader 550 (FIG. 4).

In the description of AMR sensors tailored to sensing magnetic tracks (FIGS. 10, 11, 12, 13, 14A and 14B), various embodiments were described in which each leg of a full-Wheatstone bridge consisted of at least a portion of a single strip 251. However, each leg of the full-Wheatstone bridge can be made of a plurality of strips 251 connected in series. Referring back to FIG. 9, each leg 651, 652, 653, and 654 of the Wheatstone bridge 650 includes several strips of transition metal alloy connected in series. This allows one to create a desired resistance for the sensor, thus reducing sensor's power consumption for a constant voltage supply.

Figure 15:
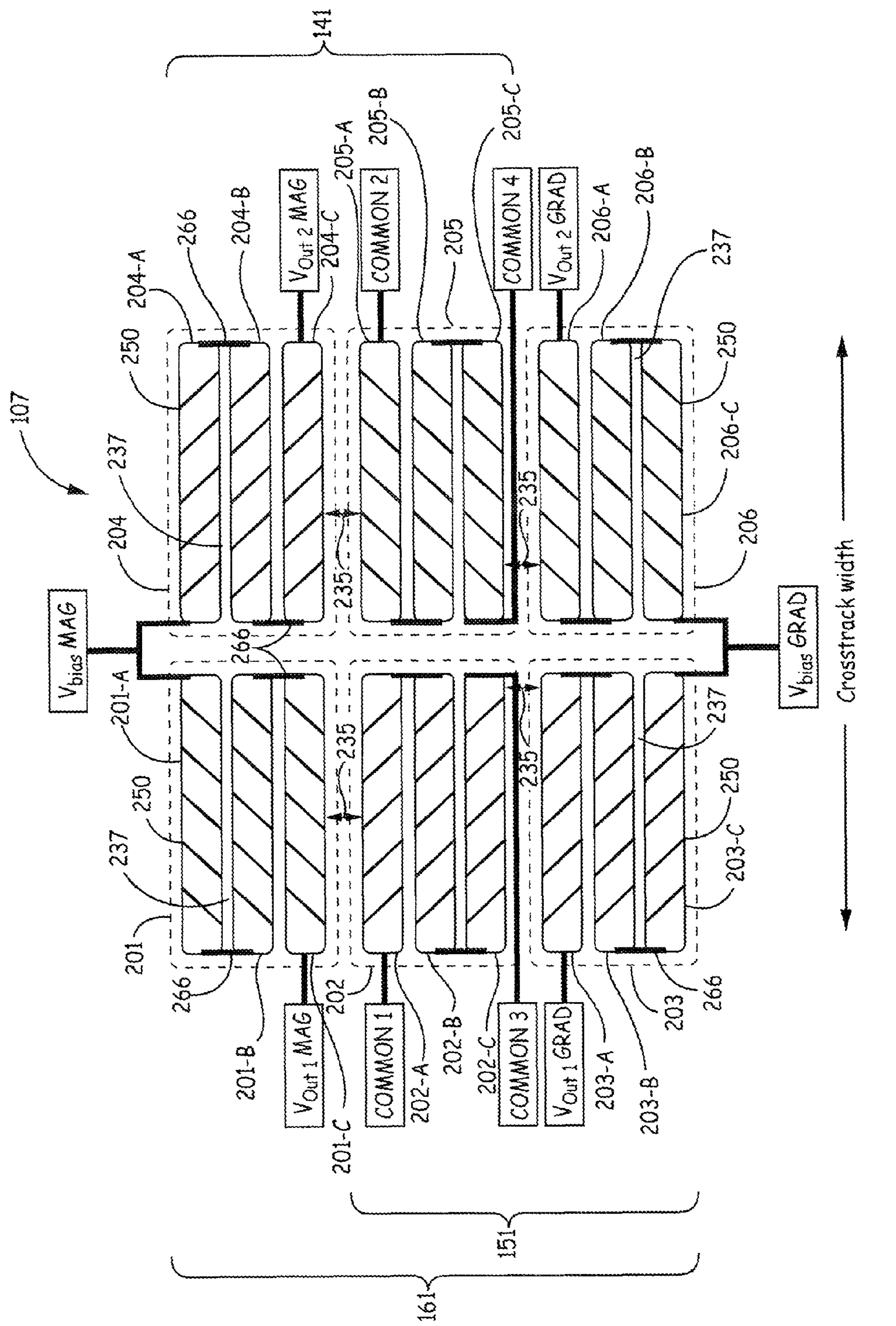
FIG. 15 shows an embodiment of an AMR sensor that is a combination of a magnetometer and a gradiometer.

Since AMR sensors are fabricated on silicon, one can readily lay out a gradiometer and a magnetometer adjacent to each other. Thus, on the same sensor chip, one can sense both the magnetic field and its gradient of the magnetic track 410 in the same card swipe and without the need for complex assembly. FIG. 15 shows an embodiment of an AMR sensor 161 that is a combination of a magnetometer and a gradiometer. This is referred to herein a "magnetometer/gradiometer combination sensor 161" or a "magnetometer/gradiometer combination 161". As shown in FIG. 15, the magnetometer/gradiometer combination sensor 161 includes a full-Wheatstone bridge 107 that has six legs 201, 202, 203, 204, 205, and 206. In this exemplary embodiment, each leg 201, 202, 203, 204, 205, and 206 is formed from a plurality of strips 251 connected in series by conductive material represented generally at 266. For example, first leg 201 includes strips 201-A, 201-B, and 201-C. Likewise, second leg 202 includes strips 202-A, 202-B, and 202-C, and so forth. The spacing 237 (also referred to as gap 237) between intra-leg strips (e.g., between 201-A and 201-B and between 201-B, and 201-C) is determined by the capability of photolithography and other metal fabrication processes, but is generally on the order of a few microns. Thus, the spacing 237 between intra-leg strips is not necessarily on the order of a length of a transition on a magnetic track 410 to be sensed.

Legs 201, 202, 204, and 205 are overlaid by barber pole nonmagnetic shorting bars in a magnetometer configuration. Thus, legs 201, 202, 204, and 205 form the AMR magnetometer sensor 141 in the magnetometer/gradiometer combination sensor 161. Legs 202, 203, 205, and 206 are overlaid by barber pole nonmagnetic shorting bars in a gradiometer configuration. Thus, legs 202, 203, 205, and 206 form the AMR gradiometer sensor 151 in the magnetometer/gradiometer combination sensor 161.

The inner gap 235 between third strip 201-C of the first leg 201 and the parallel and adjacent first strip 202-A of second leg 202 is on the order of the length of the transitions 476-1, 476-2, and 476-3 (FIG. 1*i*) (i.e., the transition length $L_t$) on a magnetic track 410 to be sensed (e.g., on the magnetic card 450 to be read).

The inner gap 235 between third strip 202-C of the second leg 202 and the parallel and adjacent first strip 203-A of third leg 203 is on the order of the length of transition length $L_t$. The inner gap 235 between third strip 204-C of the fourth leg 204 and the parallel and adjacent first strip 205-A of fifth leg 205 is on the order of the length of transition length $L_t$. The inner gap 235 between third strip 205-C of the fifth leg 205 and the parallel and adjacent first strip 206-A of sixth leg 206 is on the order of the length of transition length $L_t$.

Thus, the first leg 101 and second leg 102 are separated by the inner gap 235 and the fourth leg 104 and fifth leg 105 are separated by the inner gap 235. Likewise, the second leg 102 and third leg 103 are separated by the inner gap 235 and the fifth leg 105 and sixth leg 106 are separated by the inner gap 235. As shown in FIG. 15, the crosstrack width of the AMR sensor 161 is less than the track width $W_{track}$.

The AMR sensor 161 has the following electrical contact points: a COMMON 1 contact connected to the first strip 202-A of second leg 202; a COMMON 2 contact connected to the first strip 205-A of fifth leg 205; a COMMON 3 contact connected to the third strip 202-C of second leg 202; a COMMON 4 contact connected to the third strip 205-C of fifth leg 205; $V_{out1MAG}$ contact connected to the third strip 201-C of first leg 201; $V_{out2MAG}$ contact connected to the third strip 204-C of the fourth leg 204; $V_{out1GRAD}$ contact connected to the first strip 203-A of third leg 203; $V_{out2GRAD}$ contact connected to the first strip 206-A of sixth leg 206; $V_{biasMAG}$ contact connected to both the first strip 201-A of first leg 201 and first strip 204-A of fourth leg 204; and $V_{biasaGRAD}$ contact connected to both the first strip 203-A of third leg 203 and the first strip 206-A of sixth leg 206.

In order to operate the AMR sensor 161 as a magnetometer 141, the $V_{out1MAG}$ is connected to COMMON 1, $V_{out2MAG}$ is connected to COMMON 2, while COMMON 4 is connected to COMMON 5. The bias voltage is then measured at $V_{biasMAG}$.

In order to operate the AMR sensor 161 as a gradiometer 151, the $V_{out1GRAD}$ is connected to COMMON 3, $V_{out2GRAD}$ is connected to COMMON 4, while COMMON 1 is connected to COMMON 2. The bias voltage is then measured at $V_{biasGRAD}$.

In one implementation of this embodiment, an external circuit is used to switch the connections so that the AMR sensor 161 switches between operating as the magnetometer 141 and the gradiometer 151. In another implementation of this embodiment, the magnetometer/gradiometer combination sensor 161 is configured with more than with three strips per leg. In yet another implementation of this embodiment, the magnetometer/gradiometer combination sensor 161 is configured with fewer than three strips per leg.

The sensor configurations described so far are all powered using a constant supply voltage source. Another design variation, applicable both to magnetometer and gradiometer configurations is the "half bridge" configuration that is supplied with two constant current sources.

Figure 16:
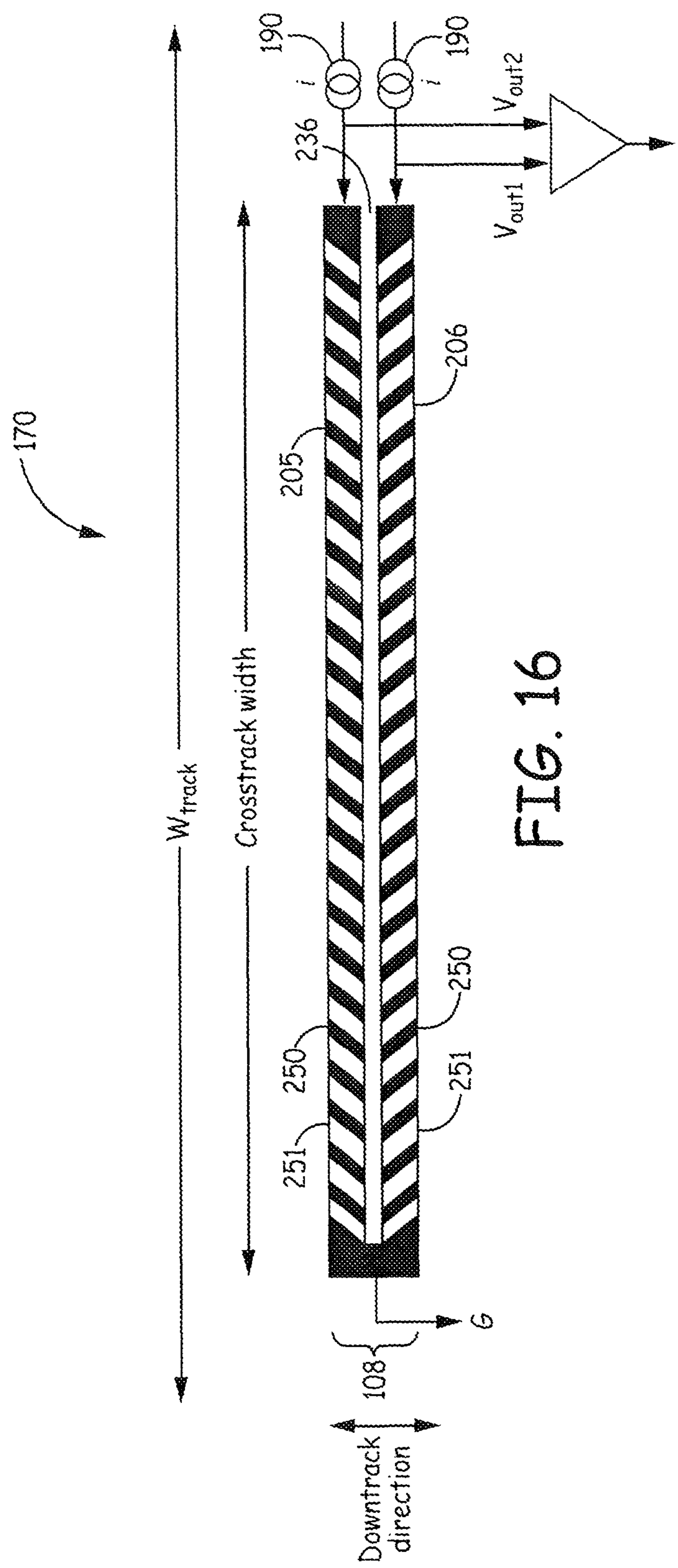
FIG. 16 shows a magnetometer configuration operated in a half-Wheatstone bridge configuration using two constant current sources in accordance with the present invention.

FIG. 16 shows an AMR sensor 170 in a magnetometer configuration operated in a half-Wheatstone bridge configuration using two constant current sources 190 in accordance with the present invention. The AMR sensor 170 in a magnetometer configuration includes a half-Wheatstone bridge 108 with two legs 205 and 206. Each leg 205 and 206 includes a strip of magnetic material 251 and barber pole nonmagnetic shorting bars 250. In one implementation of this embodiment, the constant current mode is applied to a gradiometer configuration of a sensor. In either case, the voltages $V_{out1}$ and $V_{out2}$ across the two legs 205 and 206 of the half-Wheatstone bridge 108 are differentially measured. The voltage difference is proportional either to the magnetic field or its gradient in the downtrack direction.

For applications sensing magnetic information on a magnetic track (e.g., a credit card application) the sensor crosstrack width is designed to be smaller than the trackwidth $W_{track}$. In one implementation of this embodiment, the sensor crosstrack width is about 1.4 mm and the trackwidth $W_{track}$ is about 3 mm. As such, it is expected that the magnetic field from the media transition is uniform over the width (crosstrack width) of the sensor. However, this is not true of the noise pattern since the noise arises from variations in the grain structure of the medium of the magnetic strip 251. Each leg 205 and 206 of the half bridge 108 integrates the signal from the medium over the entire width (crosstrack width) of the sensor 170. This is similar to the inductive reader.

By contrast, the full bridges as shown in FIGS. 10 and 11, 12, 13, and 14 split the sensor signal region in two halves. This does not pose any problem either for the detection of signals from transitions or to the noise signature-based correlation. But it is different from the inductive reader. In one implementation of this embodiment, a full bridge is configured so that each leg integrates the signal from the entire sensor along the longest extent (i.e., in the y direction in FIGS. 11 and 12). In this latter case, at least two of the legs are separated by more than the gap length g.

Figure 17:
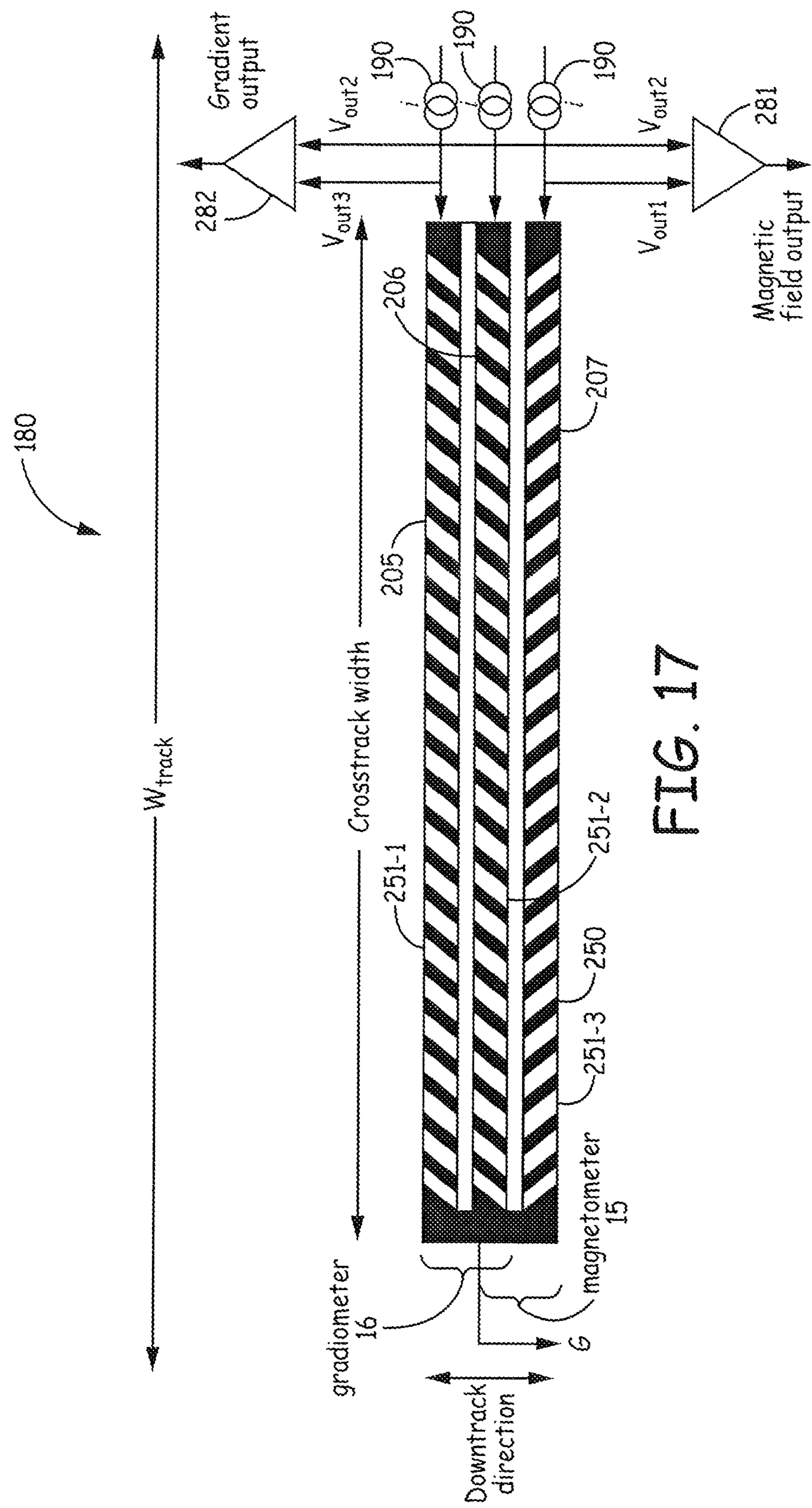
FIG. 17 shows an anisotropic magneto-resistance sensor including a gradiometer and a magnetometer in accordance with the present invention.

FIG. 17 shows an anisotropic magneto-resistance sensor 180 formed from an integration of a gradiometer 16 and a magnetometer 15 in accordance with the present invention. The AMR sensor 180 is operable to sense both the magnetic field and its gradient of the magnetic track 410 in the same card swipe and without the need for complex assembly. The anisotropic magneto-resistance sensor 180 includes a half-Wheatstone bridge, which includes three legs 205, 206, and 207 formed from at least three respective strips 251-1, 251-2, and 251-3, respectively. Three constant current sources 190 each provide a constant current input to the three legs 205, 206, and 207, respectively.

A first portion of the barber pole nonmagnetic shorting bars 250 are arranged on a first portion 15 of two strips 251-3 and 251-2 that form the two respective legs 207 and 206 to form a magnetometer 15. The voltages $V_{out1}$ and $V_{out2}$ across the respective legs 207 and 206 are differentially measured at an operation amplifier 281 for a magnetic field output.

A second portion of the barber pole nonmagnetic shorting bars 250 are arranged on a second portion 16 of the two strips 251-1 and 251-2 that form the two respective legs 205 and 206 to form a gradiometer 16. The voltages $V_{out2}$ and $V_{out3}$ across the respective legs 205 and 206 are differentially measured at a second operation amplifier 282 for a gradient output.

In one implementation of this embodiment, the magnetometers, gradiometers, and magnetometer/gradiometer combinations described herein are fabricated on silicon as discrete sensors. In another implementation of this embodiment, the magnetometers, gradiometers, and magnetometer/gradiometer combinations described herein are integrated on silicon with signal processing and control electronics processed in silicon using CMOS (or other) processes. The interface between the sensor and electronics in an integrated system is more robust and immune from tampering than a sensor using discrete components assembled and packaged with the signal processing and control electronics. Thus, the magnetometers, gradiometers, and magnetometer/gradiometer combinations integrated on silicon with signal processing and control electronics provide a high level of security. In general, a solid state sensor packaged using IC assembly techniques is more secure against tampering than an inductive sensor.

Figure 18:
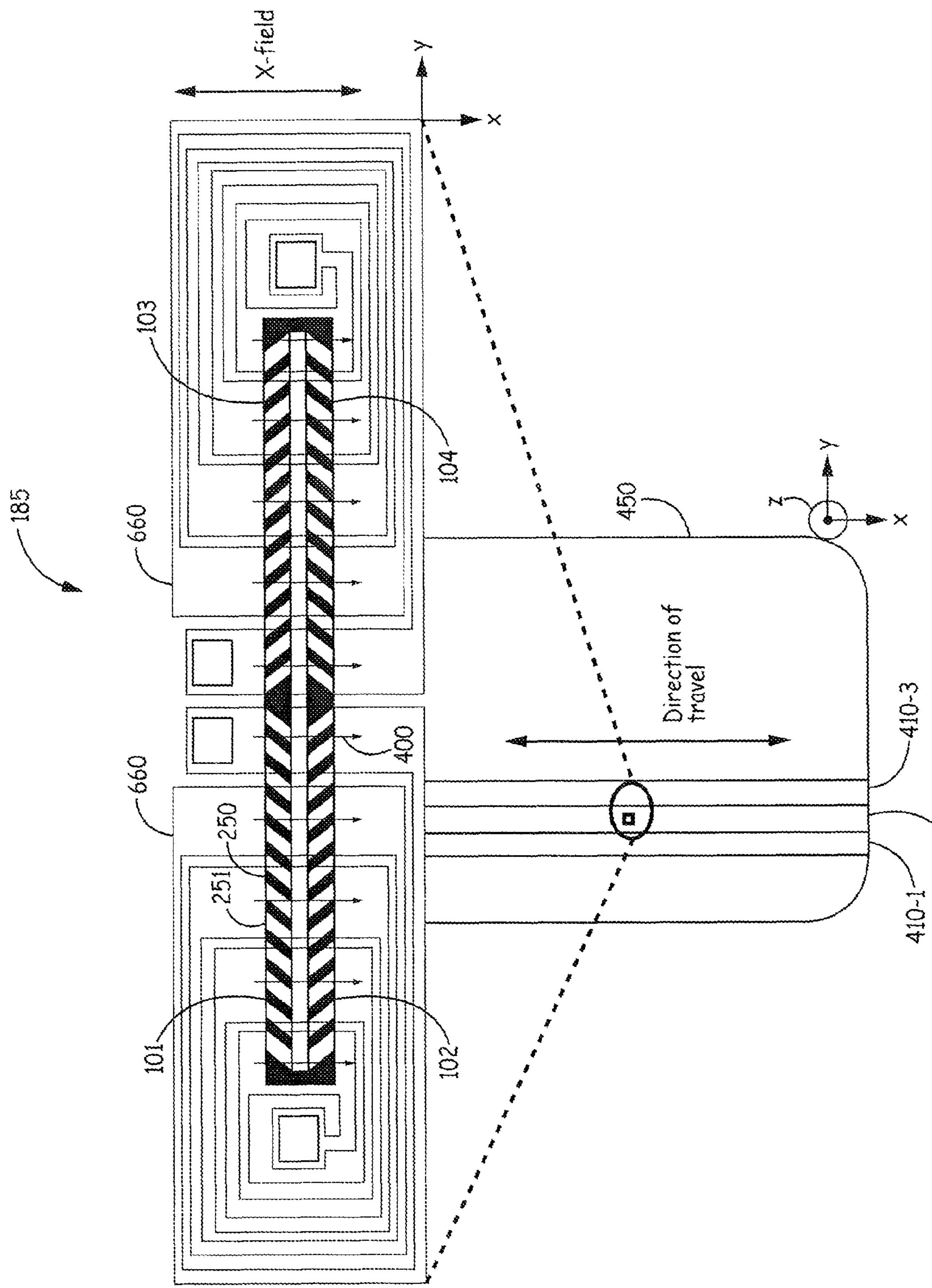
FIG. 18 shows an anisotropic magneto-resistance sensor used to detect the x-field from a credit card track in accordance with the present invention.

FIG. 18 shows an anisotropic magneto-resistance sensor 185 used to detect the x-field 400 from a credit card track 410-2 in accordance with the present invention. For ease of viewing, the AMR sensor 185 is shown with the active face up. The AMR sensor 185 is in the x-y plane and parallel to the surface of the card 450 being read in the x-y plane.

Figure 19:
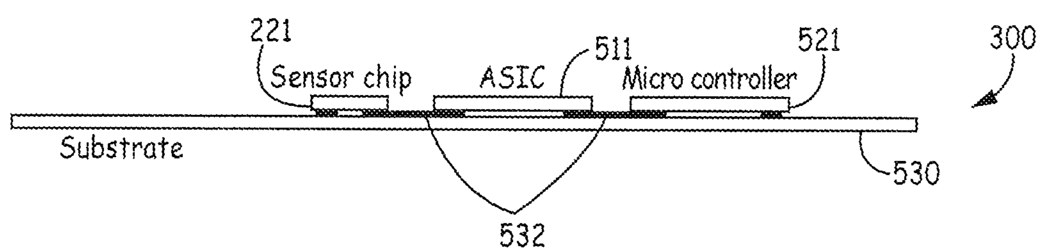
FIGS. 19 and 20 show embodiments of integrated devices to sense at least one of magnetic fields and magnetic field gradients in accordance with the present invention.
Figure 20:
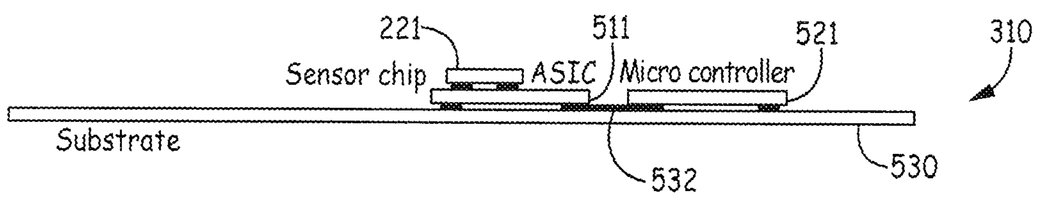

FIGS. 19 and 20 show embodiments of integrated devices 300 and 310, respectively, to sense at least one of magnetic fields and magnetic field gradients in accordance with the present invention. The integrated devices 300 and 310 are also referred to herein as integrated cards readers 300 and 310, respectively, and "integrated magnetic track readers 300 and 310". The integrated devices 300 and 310 each include a solid state magnetic sensor 221, an application-specific integrated circuit (ASIC) 511, and a microcontroller 521 all on the same substrate 530 and communicatively coupled to each other via substrate connectors 532. The solid state magnetic sensor 221 of the integrated magnetic card reader 300 or 310 is any one of the embodiments of the AMR sensors described herein.

When a magnetic track 410-*i* on a magnetic card 450 is moved in a downtrack direction, at least one of magnetic fields or magnetic field gradients is sensed by the integrated magnetic card reader 300 or 310. The noise patterns 605 (FIG. 6) are detectable by the solid state magnetic sensors 220 in the integrated cards readers 300 and 310 in order to detect if the magnetic card 450 is a duplicated card. The ASIC 511 and the microcontroller 521 amplify, digitize, encrypt, and initiate transmission of information from the read magnetic card 450 to servers. The functions of amplification, digitization, transmission and control, etc., are internal to the solid state ASIC 511, and the microcontroller 521.

In one implementation of this embodiment, the solid state ASIC 511, and the microcontroller 521 execute software to perform at least some of the amplification, digitization, transmission, and control functions. At least a portion of such software and/or firmware executed by the solid state ASIC 511 and/or the microcontroller 521 and any related data structures are stored in storage medium during execution. Memory comprises any suitable memory now known or later developed such as, for example, random access memory (RAM), read only memory (ROM), and/or registers within the solid state ASIC 511 and/or the microcontroller 521. Moreover, although the solid state ASIC 511 and the microcontroller 521 are shown as separate elements in FIG. 1, in one implementation, the ASIC 511 and the microcontroller 521 are implemented in a single device (for example, a single integrated-circuit device). The software and/or firmware executed by the solid state ASIC 511 and/or the microcontroller 521 comprises a plurality of program instructions that are stored or otherwise embodied on a storage medium from which at least a portion of such program instructions are read for execution by the solid state ASIC 511 and/or the microcontroller 521. In one implementation, the microcontroller 521 includes processor support chips and/or system support chips. In another implementation of this embodiment, the ASIC is replaced by a field programmable gate array (FPGA).

As shown in FIG. 19, the solid state magnetic sensor 221 (sensor chip 221) is mounted on the substrate 530 using techniques known in the art. Substrate connectors 532 in the substrate 530 communicatively couple the solid state magnetic sensor 221 to an ASIC 511 on the substrate 530 via contacts 532 in or on the substrate 530. Substrate connectors 532 in the substrate 530 communicatively couple the ASIC 511 to a microcontroller 521 on the substrate 530. In this manner, the connection between the anisotropic magneto-resistance sensor 221 and the ASIC 511 is made using substrate connectors, and is less susceptible to tampering than prior art technologies that use inductive head readers, such as inductive reader 505 shown in FIGS. 3 and 4.

Specifically, the substrate connectors provide an attachment of the anisotropic magneto-resistance sensor 221 to the substrate 530 is more secure than the attachment of the wires 502 to ASIC 510 shown in the prior art card reader device 499 shown in FIG. 4. Attempts to read the output of the anisotropic magneto-resistance sensor 221 would damage the integrated magnetic card reader 300. In one implementation of this embodiment, the anisotropic magneto-resistance sensor 221 and the ASIC 511 are covered with protective coatings to further protect the integrated magnetic card reader 300 from tampering.

As shown in FIG. 20, the solid state magnetic sensor 221 (sensor chip 221) is mounted on the application-specific integrated circuit (ASIC) 511. Substrate connectors 532 in or on the substrate 530 communicatively couple the ASIC 511 to the microcontroller 521 on the substrate 530. Since the integrated magnetic card reader 310 includes an anisotropic magneto-resistance sensor 221 mounted directly on (and communicatively coupled to) the ASIC 511, the connection between the sensor 221 and ASIC 511 are confined to the region between the sensor chip 221 and the ASIC chip 511. Thus, the integrated magnetic card reader 310 is less susceptible to tampering than the integrated magnetic card reader 300 of FIG. 19 and is less susceptible to tampering than the attachment of the wires 502 to ASIC 511 shown in the prior art card reader device 499 (FIG. 4). The half or full Wheatstone bridge is on the top side of the sensor chip 221 that forms the anisotropic magneto-resistance sensor 221 (i.e., facing away from the substrate 530). Electrical connections between the top and bottom sides of the sensor chip 221 (and other silicon chips) can be made using through-silicon-via (TSV) techniques. The anisotropic magneto-resistance sensor 221 described herein can be covered with protective coatings for additional anti-tampering security.

Figure 21:
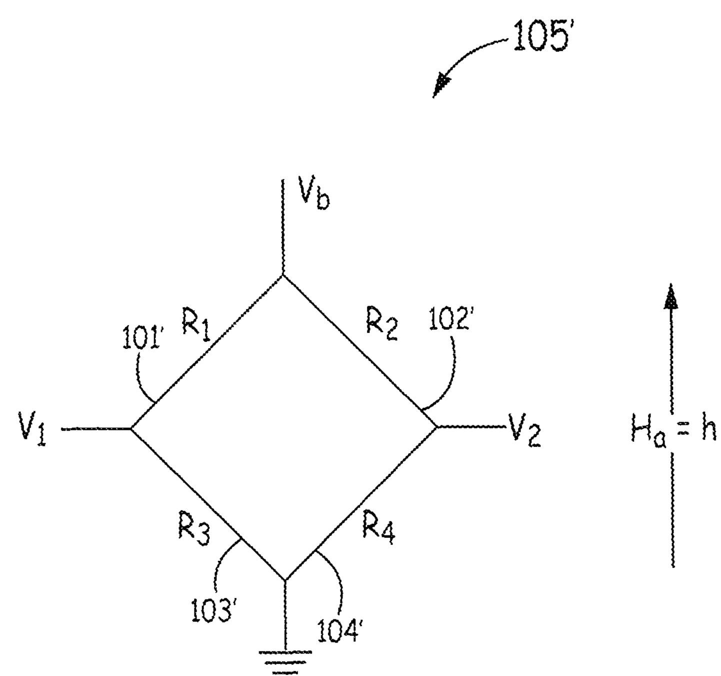
FIG. 21 shows a circuit of a Wheatstone bridge of an AMR sensor shown in FIG. 10 exposed to a magnetic field with a gradient.

FIG. 21 shows a circuit of a Wheatstone bridge 105' of an AMR sensor exposed to a magnetic field $h=H_a$ with a gradient. In the schematic of FIG. 21, the full-Wheatstone bridge 105' has four legs 101', 102', 103', and 104' and' is biased with a constant bias voltage $V_b$ or $V_{bridge}$. Without any loss of generality, assume that initially all four legs have the same resistance in the absence of applied field. For example, $R_1=R_2=R_3=R_4=R$. Also assume that, when exposed to an external magnetic field and/or magnetic field gradient, each leg changes from the initial value as follows:

$$R_1=R+\delta R_1,$$

$$R_2=R+\delta R_2,$$

$$R_3=R+\delta R_3,$$

$$R_4=R+\delta R_4 \quad (4)$$

Also assume that the change is small compared to the initial value, i.e., $\delta R_1 << R$, etc. Define, also, the fractional change, i.e., $\delta r_1 << \delta R_1/R$. Then, one obtains, $$\frac{\Delta V}{V_b} = \frac{V_1 - V_2}{V_b} \approx \frac{\delta r_1}{4} - \frac{\delta r_2}{4} - \frac{\delta r_3}{4} + \frac{\delta r_4}{4}, \quad (5)$$

where only the linear terms in the faction change $\delta r_i$ have been kept. The applied magnetic field $H_a$ changes the resistance of the four legs 101'-104'. The differential voltage between the output nodes of the bridge (e.g., Out+=$V_1$ and Out−=$V_2$) is a function of the applied magnetic field $H_a$.

The full-Wheatstone bridge 105' is a schematic representation of the full-Wheatstone bridges shown in the following FIGS. 22-25. In addition, the full-Wheatstone bridge 105' is a schematic representation of the full-Wheatstone bridge 550 of the Anisotropic Magneto-Resistance sensor 220 shown in FIG. 9. The full-Wheatstone bridge 105' also is a schematic representation of the full-Wheatstone bridge 105 of the Anisotropic Magneto-Resistance sensor 100 shown in FIG. 10.

Figure 22:
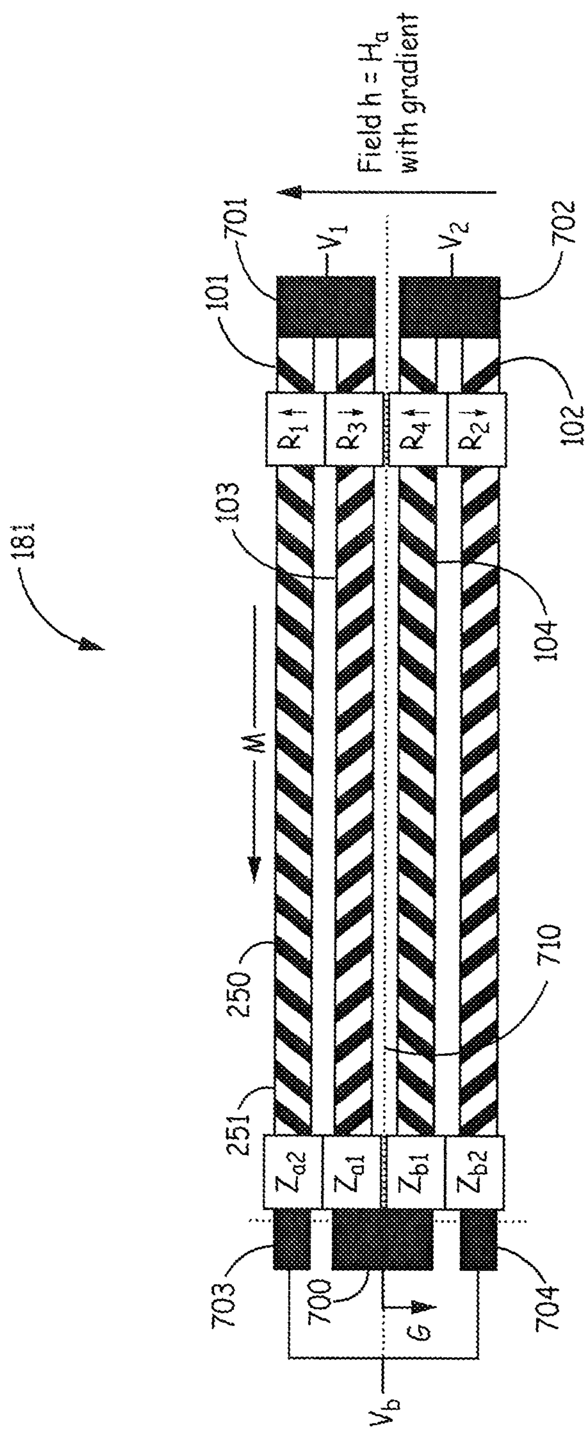
FIGS. 22-25 show various embodiments of solid state AMR sensors in accordance with the present invention.

FIGS. 22-25 show various embodiments of solid state AMR sensors in accordance with the present invention. FIG. 22 is a schematic of an AMR magnetometer 181. The AMR magnetometer 181 includes four legs 101, 102, 103, and 104 with barber pole nonmagnetic shorting bars 250 arranged for a magnetometer configuration. The barber pole nonmagnetic shorting bars 250 that overlay legs 101 and 104 are parallel to each other while the barber pole nonmagnetic shorting bars 250 that overlay legs 102 and 102 are parallel to each other and are flipped about the length of the AMR magnetometer 181 with respect to the barber pole nonmagnetic shorting bars 250 overlaying legs 101 and 104. The AMR magnetometer 181 is subjected to an indicated field $h=H_a$ with a gradient.

The change in resistance for each of the legs is indicated by an arrow next to the resistance value. As shown in FIG. 22, the first leg 101 has a resistance $R_1$ that increases (arrow next to $R_1$ points up) with the magnetic field; the second leg 102 has a resistance $R_2$ that decreases (arrow next to $R_2$ points down) with the magnetic field; the third leg 103 has a resistance $R_3$ that decreases with the magnetic field; and the fourth leg 104 has a resistance $R_4$ that increases with the magnetic field. Thus, under the influence of the indicated field, the resistance of legs 101 and 104 increases, and that of legs 102 and 103 decreases.

An electrical connection 700 to ground is attached to an end of the third leg 103 and the fourth leg 104. An electrical connection 703 to a supply voltage $V_b$ is attached to an end of the first leg 101. An electrical connection 704 to the supply voltage $V_b$ is attached to an end of the second leg 102. The first output terminal 701 ($V_1$) is attached to the other end of the legs 101 and 103. The second output terminal 702 ($V_2$) is attached to the other end of the legs 102 and 104.

Figure 23:
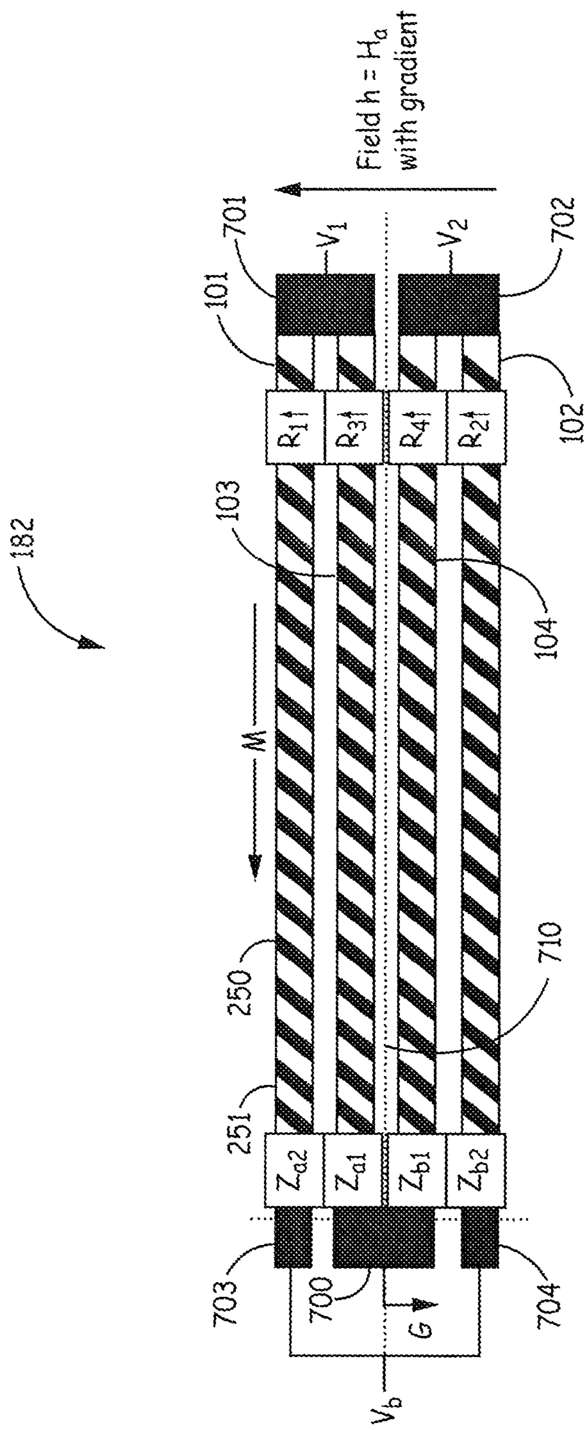

FIG. 23 is a schematic of an embodiment of an AMR gradiometer 182. AMR gradiometer 182 has the same electrical connections as shown for the AMR magnetometer 181 of FIG. 22. However the barber pole nonmagnetic shorting bars 250 are arranged for a gradiometer configuration. The barber pole nonmagnetic shorting bars 250 are parallel to each other over all the legs 101-104. The AMR gradiometer 182 is subjected to the same field $h=H_a$ with the gradient of FIG. 22, as indicated. Under the influence of the indicated field, the resistance of all the legs 101-104 increases.

To take the calculation further, assume that the legs 101-104 are equally spaced. A dashed line 710 is shown midway between the third leg 103 and the fourth leg 104, which have respective resistances $R_3$ and $R_4$. The magnetic field at each of the legs 101-104 is: $h_0+2d$ at the first leg 101, $h_0+d$ at the third leg 103, $h_0-d$ at the fourth leg 104, and $h_0-2d$ at the second leg 102. Also assume, when there is no applied field h, the resistance of each of the legs 101-104 is the same, i.e., R. The fractional change in resistance for the four legs 101-104 is given by:

$$\delta r_1=S(h_0+2d),$$

$$\delta r_3=-S(h_0+d),$$

$$\delta r_4=S(h_0-d),$$

$$\delta r_2=-S(h_0-2d). \quad (6)$$

S is the fractional change of resistance per unit of applied magnetic field h measured in %/Gauss or V/V-Gauss. Upon substituting various terms from equation (6) into equation (5), one obtains, $$\begin{aligned}\frac{\Delta V}{V_b} &= \frac{1}{4}S((h_0+2d)+(h_0-2d)+(h_0+d)+(h_0-d)) \\ &= Sh_0.\end{aligned} \quad (7)$$

Thus, the gradient term cancels out. More generally, assume that the center of coordinate system is between the two middle strips, i.e., between the third leg 103 and the fourth leg 104; the coordinates of the center of the strips are $z_{a2}$, $z_{a1}$, $z_{b1}$ and $z_{b2}$, as shown in FIG. 23. Also assume that the field h is translationally invariant along the length of the strips that form the legs 101-104. Then, the change in resistance for each of the legs is given by:

$$\delta r_1=Sh(z_{a2});$$

$$\delta r_3=-Sh(z_{a1});$$

$$\delta r_4=Sh(z_{b1}); \text{ and}$$

$$\delta r_2=-Sh(z_{b2}), \quad (8)$$

where, h(z) is the field at location z. Expanding to linear order in a Taylor series expansion, one obtains $$h(z) = h_0 + h_0' z, \quad \text{where } h_0' = \left.\frac{dh}{dz}\right|_{z=0}. \quad (9)$$

Substituting equation (8) into equation (5), one obtains, $$\begin{aligned}\frac{\Delta V}{V_b} &= \frac{1}{4}S\begin{pmatrix}(h_0+h_0'z_{a2})+(h_0+h_0'z_{b2})+ \\ (h_0+h_0'z_{a1})+(h_0+h_0'z_{b1})\end{pmatrix} \\ &= Sh_0 + Sh_0'\frac{(z_{a2}+z_{b2}+z_{a1}+z_{b1})}{4},\end{aligned} \quad (10)$$

The last expression, $(x_{a2}+z_{b2}+z_{a1}+z_{b1})/4$, is the average location of the strips, which in the way the coordinate system is defined, and for symmetrically placed strips about the origin, is zero.

Thus, $$\frac{\Delta V}{V_b} = Sh_0. \quad (11)$$

Figure 24:
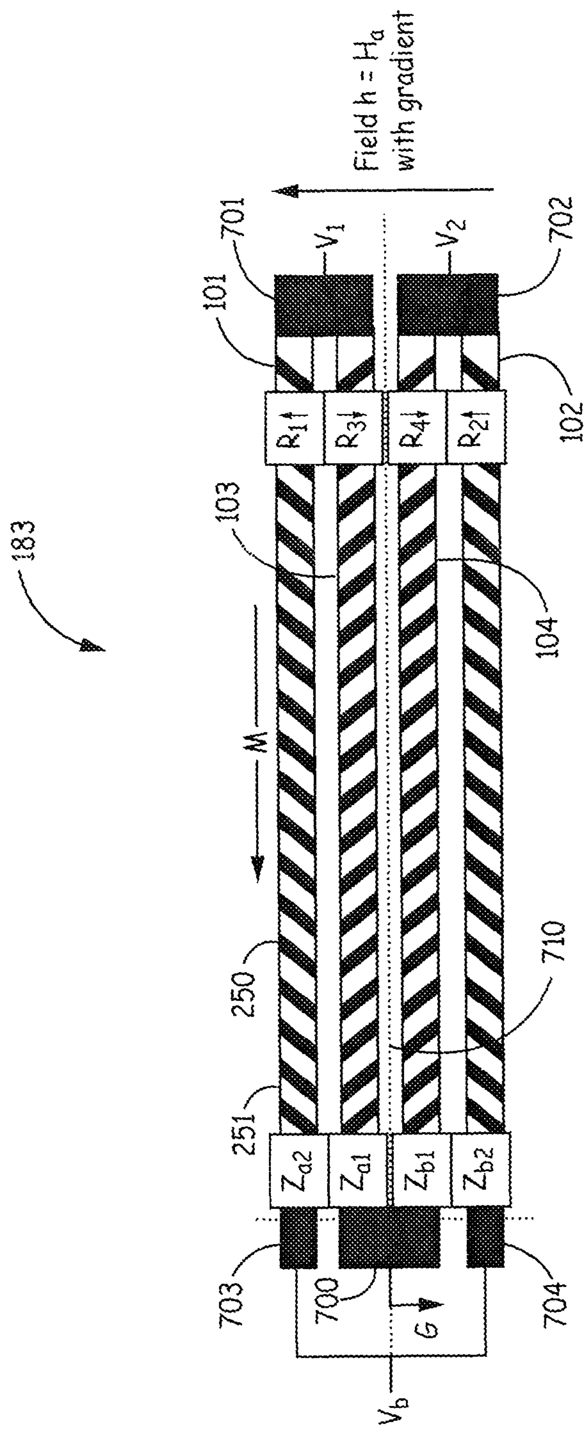
Figure 25:
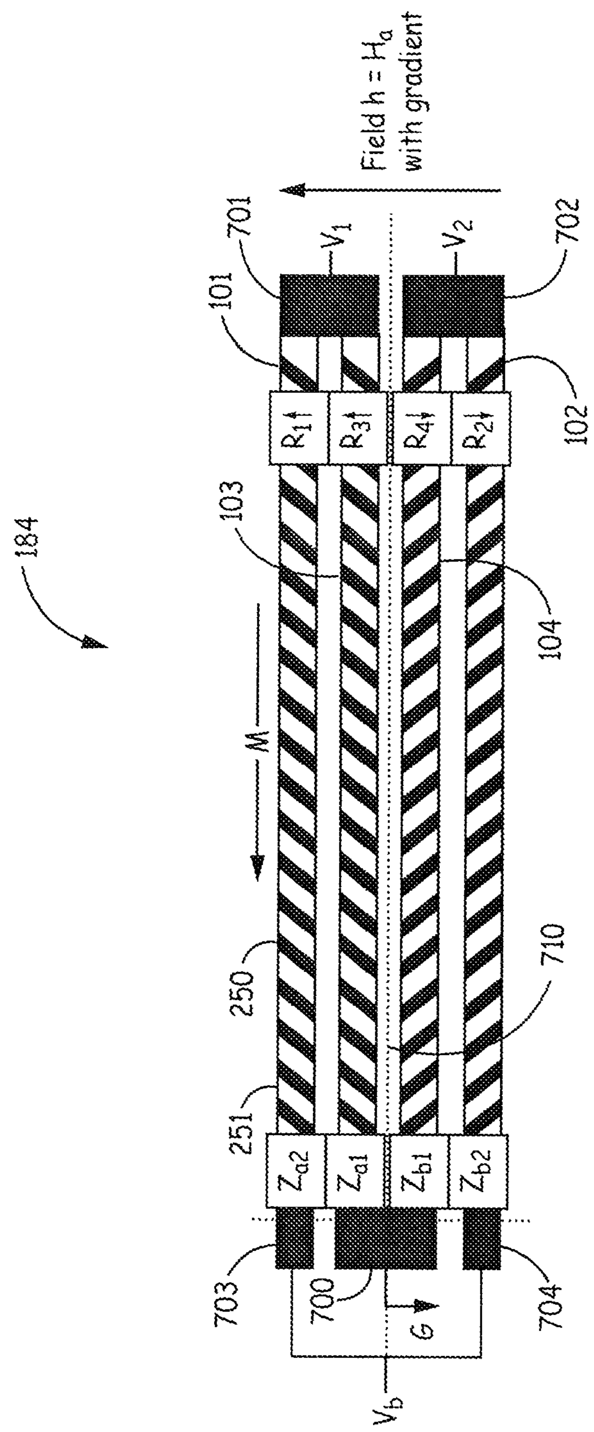

Exemplary embodiments of gradiometers are shown in FIG. 23-25. For the configuration shown in FIG. 23 the fractional change in resistance is $$\delta r_1=Sh(z_{a2}),$$

$$\delta r_3=Sh(z_{a1}),$$

$$\delta r_4=Sh(z_{b1}),$$

$$\delta r_2=Sh(Z_{b2}). \quad (12)$$

Substituting equation (11) along with the Taylor series expansion equation (9) into equation (5) gives $$\begin{aligned}\frac{\Delta V}{V_b} &= \frac{1}{4}S\begin{pmatrix}(h_0+h_0'z_{a2})-(h_0+h_0'z_{b2})- \\ (h_0+h_0'z_{a1})+(h_0+h_0'z_{b1})\end{pmatrix} \\ &= Sh_0'\frac{(z_{a2}-z_{b2}-z_{a1}+z_{b1})}{4},\end{aligned} \quad (13)$$

For a design with strips of equal widths (w) (in the direction of the field h) and equal gaps (g) between the strips, the coordinates are:

$$z_{a2}=3(g+w)/2$$

$$z_{b2}=-3(g+w)/2$$

$$z_{a1}=(g+w)/2$$

$$z_{b1}=-(g+w)/2 \quad (14)$$

resulting in, $$\frac{\Delta V}{V_b} = Sh_0'\frac{(g+w)}{2}, \tag{15}$$

For the configuration shown in FIG. 24 the fractional change in resistance is $$\delta r_1 = Sh(z_{a2}),$$

$$\delta r_3 = -Sh(z_{a1}),$$

$$\delta r_4 = -Sh(z_{b1}),$$

$$\delta r_2 = Sh(z_{b2}). \tag{16}$$

Substituting equation (16) along with the Taylor series expansion of equation (9) into equation (5) gives $$\frac{\Delta V}{V_b} = \frac{1}{4}S\begin{pmatrix}(h_0 + h_0'z_{a2}) - (h_0 + h_0'z_{b2}) + \\ (h_0 + h_0'z_{a1}) - (h_0 + h_0'z_{b1})\end{pmatrix} = Sh_0'\frac{(z_{a2} - z_{b2} + z_{a1} - z_{b1})}{4}, \tag{17}$$

For strips of equal width and equal gaps between strips as shown in equation (14) this results in $$\frac{\Delta V}{V_b} = Sh_0'(g+w). \tag{18}$$

For the configuration shown in FIG. 25 the fractional change in resistance is $$\delta r_1 = Sh(z_{a2}),$$

$$\delta r_3 = Sh(z_{a1}),$$

$$\delta r_4 = -Sh(z_{b1}),$$

$$\delta r_2 = -Sh(z_{b2}). \tag{19}$$

Substituting equation (19) along with the Taylor series expansion of equation (6) into equation (5) gives $$\frac{\Delta V}{V_b} = \frac{1}{4}S\begin{pmatrix}(h_0 + h_0'z_{a2}) + (h_0 + h_0'z_{b2}) - \\ (h_0 + h_0'z_{a1}) - (h_0 + h_0'z_{b1})\end{pmatrix} = Sh_0'\frac{(z_{a2} + z_{b2} - z_{a1} - z_{b1})}{4}, \tag{20}$$

For a symmetrical configuration $(z_{a2}+z_{b2})=0$, and $(z_{a1}+z_{b1})=0$, thus equation 20 produces, $$\frac{\Delta V}{V_b} = 0. \tag{21}$$

Thus, sensor 184 senses neither the field nor its gradient. The x-field or z-field may offer an advantage of higher field strength. In one implementation of this embodiment, packaging of the integrated magnetic card readers 300 and 310 is arranged to allow the sensor chip 221 to be oriented advantageously along one of these directions. In another implementation of this embodiment, packaging of the integrated magnetic card readers 300 and 310 is arranged to allow the sensor chip 221 to be oriented advantageously along both of these directions. In yet another implementation of this embodiment, integrated magnetic card readers 300 and 310 send information indicative of finger prints to a server based on the signals generated by the sensor chip 221. In yet another implementation of this embodiment, the AMR sensors are monolithically integrated with the electronic functions. In another implementation of this embodiment, the AMR sensors are monolithically integrated with the electronic functions based on CMOS technology. In yet another implementation of this embodiment, the chips of the AMR sensors and the related processing technology are packaged on silicon in small plastic packages using techniques such as injection molding. Tapping into sensor's raw signal would be extremely difficult to do non-destructively.

In one implementation of this embodiment, a plurality of AMR sensors are positioned in a reader to read a respective plurality of magnetic tracks on a magnetic strip as is understandable to one skilled in the art upon reading and understanding this document.

Example Embodiments

Example 1 includes a solid state magnetic sensor for sensing magnetic information on a magnetic track, the solid state magnetic sensor comprising: at least one half of a Wheatstone bridge including at least two legs, each of the at least two legs including at least a portion of a strip of magnetic material, wherein an inner gap between parallel and adjacent strips of a respective at least two legs is on the order of a transition length on the magnetic track to be sensed; and barber pole nonmagnetic shorting bars arranged on the portions of the strip forming the at least two legs of the at least one half of the Wheatstone bridge.

Example 2 includes the solid state magnetic sensor of Example 1, wherein the at least one half of the Wheatstone bridge is a half-Wheatstone bridge, the half-Wheatstone bridge comprising: two legs formed from two respective strips, wherein the barber pole nonmagnetic shorting bars are arranged on the two strips of the half-Wheatstone bridge to form one of a magnetometer or a gradiometer; and two constant current sources providing constant current input to the respective two legs, wherein voltages across the two legs of the half-Wheatstone bridge are differentially measured.

Example 3 includes the solid state magnetic sensor of Example 1, wherein the at least one half of the Wheatstone bridge is a half-Wheatstone bridge, the half-Wheatstone bridge comprising: at least three legs formed from at least three respective strips; and at least three respective constant current sources providing constant current input to the respective at least three legs, wherein a first portion of the barber pole nonmagnetic shorting bars are arranged on a first portion of the at least three strips to form a magnetometer, and voltages across the first portion of the at least three strips are differentially measured for a magnetic field output, and wherein a second portion of the barber pole nonmagnetic shorting bars are arranged on a second portion of the at least three strips to form a gradiometer, and voltages across the second portion of the at least three strips are differentially measured for a gradient output.

Example 4 includes the solid state magnetic sensor of Example 3, where the first portion and the second portion share at least one of the at least three strips.

Example 5 includes the solid state magnetic sensor of Example 1, wherein the at least one half of the Wheatstone bridge is a full-Wheatstone bridge, the full-Wheatstone bridge comprising: at least four legs formed from at least a portion of at least two strips, wherein the barber pole non-magnetic shorting bars are arranged on the at least four legs of the full-Wheatstone bridge to form one of: a magnetometer; a gradiometer; and a magnetometer/gradiometer combination.

Example 6 includes the solid state magnetic sensor of Example 5, further comprising: set-reset straps to magnetize the at least four legs of the full-Wheatstone bridge with a current pulse along a long dimension of the at least four legs.

Example 7 includes the solid state magnetic sensor of Example 5, further comprising: a linear array of magnetized permanent magnets positioned one of above or below the at least four legs of the full-Wheatstone bridge.

Example 8 includes the solid state magnetic sensor of any of Examples 5-7, wherein at least one of the at least four legs of the full Wheatstone bridge include at least a portion of three or more strips, wherein a first portion of the barber pole nonmagnetic shorting bars are arranged on at least two legs of the full-Wheatstone bridge to form a magnetometer, and wherein a second portion of the barber pole nonmagnetic shorting bars are arranged on at least two other legs of the full-Wheatstone bridge to form a gradiometer.

Example 9 includes an integrated device to sense at least one of magnetic fields and magnetic field gradients, the integrated device comprising: a solid state magnetic sensor on a substrate, the solid state magnetic sensor including: at least one half of a Wheatstone bridge including at least two legs, each of the at least two legs including at least a portion of a strip of magnetic material, wherein an inner gap between parallel and adjacent strips of a respective at least two legs is on the order of a transition length on a magnetic track to be sensed; and barber pole nonmagnetic shorting bars arranged on the portions of the strip forming the at least two legs of the at least one half of the Wheatstone bridge; and an application-specific integrated circuit (ASIC) on the substrate communicatively coupled to the solid state magnetic sensor.

Example 10 includes the integrated device of Example 9, further comprising a microcontroller on the substrate communicatively coupled to the ASIC.

Example 11 includes the integrated device of any of Examples 9-10, wherein the at least one half of the Wheatstone bridge is a half-Wheatstone bridge, the half-Wheatstone bridge comprising: two legs formed from two respective strips, wherein the barber pole nonmagnetic shorting bars are arranged on the two strips of the half-Wheatstone bridge to form one of a magnetometer or a gradiometer; and two constant current sources providing constant current input to the respective two legs, wherein voltages across the two legs of the half-Wheatstone bridge are differentially measured.

Example 12 includes the integrated device of any of Examples 9-10, wherein the at least one half of the Wheatstone bridge is a half-Wheatstone bridge, the half-Wheatstone bridge comprising: at least three legs formed from at least three respective strips; and at least three respective constant current sources providing constant current input to the respective at least three legs, wherein a first portion of the barber pole nonmagnetic shorting bars are arranged on a first portion of the at least three strips to form a magnetometer, and voltages across the first portion of the at least three strips are differentially measured for a magnetic field output, and wherein a second portion of the barber pole nonmagnetic shorting bars are arranged on a second portion of the at least three strips to form a gradiometer, and voltages across the second portion of the at least three strips are differentially measured for a gradient output.

Example 13 includes the integrated device of Example 12, where the first portion and the second portion share at least one of the at least three strips.

Example 14 includes the integrated device of any of Examples 9-11, wherein the at least one half of the Wheatstone bridge is a full-Wheatstone bridge, the full-Wheatstone bridge comprising: at least four legs formed from at least a portion of at least two strips, wherein the barber pole non-magnetic shorting bars are arranged on the at least four legs of the full-Wheatstone bridge to form one of: a magnetometer; a gradiometer; and a magnetometer/gradiometer combination.

Example 15 includes the integrated device of Example 14, further comprising: set-reset straps to magnetize the at least four legs of the full-Wheatstone bridge with a current pulse along a long dimension of the at least four legs.

Example 16 includes the integrated device of Example 14, further comprising: a linear array of magnetized permanent magnets positioned either above or below the at least four legs of the full-Wheatstone bridge.

Example 17 includes the integrated device of any of Examples 9-10 and 14-16, wherein at least one of the at least four legs of the full Wheatstone bridge include at least a portion of three or more strips, wherein a first portion of the barber pole nonmagnetic shorting bars are arranged on at least two legs of the full-Wheatstone bridge to form a magnetometer, and wherein a second portion of the barber pole nonmagnetic shorting bars are arranged on at least two other legs of the full-Wheatstone bridge to form a gradiometer.

Example 18 includes an integrated magnetic track reader comprising: a solid state magnetic sensor on a substrate, the solid state magnetic sensor including: at least one half of a Wheatstone bridge including at least two legs, each of the at least two legs including at least a portion of a strip of magnetic material, wherein an inner gap between parallel and adjacent strips of a respective at least two legs is on the order of a transition length on a magnetic track to be read; and barber pole nonmagnetic shorting bars arranged on the portions of the strip forming the at least two legs of the at least one half of the Wheatstone bridge; an application-specific integrated circuit (ASIC) on the substrate; and substrate connectors in the substrate to communicatively couple the solid state magnetic sensor to the ASIC, wherein when the magnetic track is moved in a downtrack direction, at least one of magnetic fields and magnetic field gradients is sensed.

Example 19 includes the integrated magnetic track reader of Example 18, wherein at least one of an x-axis magnetic field, an x-axis magnetic field gradient, a z-axis magnetic field, and a z-axis magnetic field gradient is sensed.

Example 20 includes the integrated magnetic track reader of any of Examples 18-19, wherein the at least one half of the Wheatstone bridge is a full-Wheatstone bridge, the full-Wheatstone bridge comprising: at least four legs formed from at least a portion of at least two strips, wherein the barber pole nonmagnetic shorting bars are arranged on the at least four legs of the full-Wheatstone bridge to form one of: a magnetometer; a gradiometer; and a magnetometer/gradiometer combination.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A solid state magnetic sensor for sensing magnetic information on a magnetic track, the solid state magnetic sensor comprising:

at least one half of a Wheatstone bridge including at least two legs, each of the at least two legs including at least a portion of a strip of magnetic material, wherein an inner gap between parallel and adjacent strips of a respective at least two legs is on the order of a transition length on the magnetic track to be sensed; and barber pole nonmagnetic shorting bars arranged on the portions of the strip forming the at least two legs of the at least one half of the Wheatstone bridge.

2. The solid state magnetic sensor of claim 1, wherein the at least one half of the Wheatstone bridge is a half-Wheatstone bridge, the half-Wheatstone bridge comprising:

two legs formed from two respective strips, wherein the barber pole nonmagnetic shorting bars are arranged on the two strips of the half-Wheatstone bridge to form one of a magnetometer or a gradiometer; and two constant current sources providing constant current input to the respective two legs, wherein voltages across the two legs of the half-Wheatstone bridge are differentially measured.

3. The solid state magnetic sensor of claim 1, wherein the at least one half of the Wheatstone bridge is a half-Wheatstone bridge, the half-Wheatstone bridge comprising:

at least three legs formed from at least three respective strips; and at least three respective constant current sources providing constant current input to the respective at least three legs, wherein a first portion of the barber pole nonmagnetic shorting bars are arranged on a first portion of the at least three strips to form a magnetometer, and voltages across the first portion of the at least three strips are differentially measured for a magnetic field output, and wherein a second portion of the barber pole nonmagnetic shorting bars are arranged on a second portion of the at least three strips to form a gradiometer, and voltages across the second portion of the at least three strips are differentially measured for a gradient output.

4. The solid state magnetic sensor of claim 3, where the first portion and the second portion share at least one of the at least three strips.

5. The solid state magnetic sensor of claim 1, wherein the at least one half of the Wheatstone bridge is a full-Wheatstone bridge, the full-Wheatstone bridge comprising:

at least four legs formed from at least a portion of at least two strips, wherein the barber pole nonmagnetic shorting bars are arranged on the at least four legs of the full-Wheatstone bridge to form one of: a magnetometer; a gradiometer; and a magnetometer/gradiometer combination.

6. The solid state magnetic sensor of claim 5, further comprising:

set-reset straps to magnetize the at least four legs of the full-Wheatstone bridge with a current pulse along a long dimension of the at least four legs.

7. The solid state magnetic sensor of claim 5, further comprising:

a linear array of magnetized permanent magnets positioned one of above or below the at least four legs of the full-Wheatstone bridge.

8. The solid state magnetic sensor of claim 5, wherein at least one of the at least four legs of the full Wheatstone bridge include at least a portion of three or more strips, wherein a first portion of the barber pole nonmagnetic shorting bars are arranged on at least two legs of the full-Wheatstone bridge to form a magnetometer, and wherein a second portion of the barber pole nonmagnetic shorting bars are arranged on at least two other legs of the full-Wheatstone bridge to form a gradiometer.

9. An integrated device to sense at least one of magnetic fields and magnetic field gradients, the integrated device comprising:

a solid state magnetic sensor on a substrate, the solid state magnetic sensor including:

at least one half of a Wheatstone bridge including at least two legs, each of the at least two legs including at least a portion of a strip of magnetic material, wherein an inner gap between parallel and adjacent strips of a respective at least two legs is on the order of a transition length on a magnetic track to be sensed; and barber pole nonmagnetic shorting bars arranged on the portions of the strip forming the at least two legs of the at least one half of the Wheatstone bridge; and an application-specific integrated circuit (ASIC) on the substrate communicatively coupled to the solid state magnetic sensor.

10. The integrated device of claim 9, further comprising:

a microcontroller on the substrate communicatively coupled to the ASIC.

11. The integrated device of claim 9, wherein the at least one half of the Wheatstone bridge is a half-Wheatstone bridge, the half-Wheatstone bridge comprising:

two legs formed from two respective strips, wherein the barber pole nonmagnetic shorting bars are arranged on the two strips of the half-Wheatstone bridge to form one of a magnetometer or a gradiometer; and two constant current sources providing constant current input to the respective two legs, wherein voltages across the two legs of the half-Wheatstone bridge are differentially measured.

12. The integrated device of claim 9, wherein the at least one half of the Wheatstone bridge is a half-Wheatstone bridge, the half-Wheatstone bridge comprising:

at least three legs formed from at least three respective strips; and at least three respective constant current sources providing constant current input to the respective at least three legs, wherein a first portion of the barber pole nonmagnetic shorting bars are arranged on a first portion of the at least three strips to form a magnetometer, and voltages across the first portion of the at least three strips are differentially measured for a magnetic field output, and wherein a second portion of the barber pole nonmagnetic shorting bars are arranged on a second portion of the at least three strips to form a gradiometer, and voltages across the second portion of the at least three strips are differentially measured for a gradient output.

13. The integrated device of claim 12, where the first portion and the second portion share at least one of the at least three strips.

14. The integrated device of claim 9, wherein the at least one half of the Wheatstone bridge is a full-Wheatstone bridge, the full-Wheatstone bridge comprising:

at least four legs formed from at least a portion of at least two strips, wherein the barber pole nonmagnetic shorting bars are arranged on the at least four legs of the full-Wheatstone bridge to form one of: a magnetometer; a gradiometer; and a magnetometer/gradiometer combination.

15. The integrated device of claim 14, further comprising:

set-reset straps to magnetize the at least four legs of the full-Wheatstone bridge with a current pulse along a long dimension of the at least four legs.

16. The integrated device of claim 14, further comprising:
a linear array of magnetized permanent magnets positioned either above or below the at least four legs of the full-Wheatstone bridge.

17. The integrated device of claim 14, wherein at least one of the at least four legs of the full Wheatstone bridge include at least a portion of three or more strips,
wherein a first portion of the barber pole nonmagnetic shorting bars are arranged on at least two legs of the full-Wheatstone bridge to form a magnetometer, and
wherein a second portion of the barber pole nonmagnetic shorting bars are arranged on at least two other legs of the full-Wheatstone bridge to form a gradiometer.

18. An integrated magnetic track reader comprising:
a solid state magnetic sensor on a substrate, the solid state magnetic sensor including:
at least one half of a Wheatstone bridge including at least two legs, each of the at least two legs including at least a portion of a strip of magnetic material, wherein an inner gap between parallel and adjacent strips of a respective at least two legs is on the order of a transition length on a magnetic track to be read; and
barber pole nonmagnetic shorting bars arranged on the portions of the strip forming the at least two legs of the at least one half of the Wheatstone bridge;
an application-specific integrated circuit (ASIC) on the substrate; and
substrate connectors in the substrate to communicatively couple the solid state magnetic sensor to the ASIC, wherein when the magnetic track is moved in a down-track direction, at least one of magnetic fields and magnetic field gradients is sensed.

19. The integrated magnetic track reader of claim 18, wherein at least one of an x-axis magnetic field, an x-axis magnetic field gradient, a z-axis magnetic field, and a z-axis magnetic field gradient is sensed.

20. The integrated magnetic track reader of claim 18, wherein the at least one half of the Wheatstone bridge is a full-Wheatstone bridge, the full-Wheatstone bridge comprising:
at least four legs formed from at least a portion of at least two strips, wherein the barber pole nonmagnetic shorting bars are arranged on the at least four legs of the full-Wheatstone bridge to form one of: a magnetometer; a gradiometer; and a magnetometer/gradiometer combination.

* * * * *